United States Patent
Kim et al.

(10) Patent No.: US 12,369,261 B2
(45) Date of Patent: Jul. 22, 2025

(54) DISPLAY DEVICE

(71) Applicant: SAMSUNG DISPLAY CO., LTD., Yongin-si (KR)

(72) Inventors: Sang Jae Kim, Seongnam-si (KR); Jeoung Sub Lee, Seoul (KR); Ju Hee Song, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 598 days.

(21) Appl. No.: 17/852,519

(22) Filed: Jun. 29, 2022

(65) Prior Publication Data

US 2023/0171902 A1 Jun. 1, 2023

(30) Foreign Application Priority Data

Dec. 1, 2021 (KR) ........................ 10-2021-0169912

(51) Int. Cl.
| | |
|---|---|
| *H05K 5/00* | (2025.01) |
| *B32B 7/12* | (2006.01) |
| *C09J 7/35* | (2018.01) |
| *C09J 7/38* | (2018.01) |
| *G06F 3/046* | (2006.01) |

(52) U.S. Cl.
CPC ............. *H05K 5/0018* (2022.08); *B32B 7/12* (2013.01); *C09J 7/35* (2018.01); *C09J 7/38* (2018.01); *B32B 2457/20* (2013.01); *C09J 2301/302* (2020.08); *G06F 3/046* (2013.01)

(58) Field of Classification Search
CPC .......... B32B 2457/20; B32B 2457/202; B32B 2457/204; B32B 2457/206; B32B 2457/208; G02F 1/133305; H05K 5/0217; H05K 5/0226; H05K 5/03
See application file for complete search history.

(56) References Cited

FOREIGN PATENT DOCUMENTS

| KR | 10-2024252 | | 9/2019 |
|---|---|---|---|
| KR | 20210083930 | * | 7/2021 |

OTHER PUBLICATIONS

KR 2021-0083930 Machine Translation (Year: 2021).*

* cited by examiner

*Primary Examiner* — Zachary M Davis
(74) *Attorney, Agent, or Firm* — F. CHAU & ASSOCIATES, LLC

(57) ABSTRACT

A display device having a display panel including first and second folding areas, a first non-folding area between the first and second folding areas, and a second non-folding area. A panel support is disposed on a lower side of the display panel and includes a first lattice pattern overlapping the first folding area, a second lattice pattern overlapping the second folding area, a first flat plate overlapping the first non-folding area, and a second flat plate overlapping the second non-folding area. An adhesive member is interposed between the display panel and the panel support and includes a first adhesive member disposed directly on the first flat plate and a second adhesive member disposed directly on the second flat plate. An adhesive force between the first adhesive member and the first flat plate is greater than an adhesive force between the second adhesive member and the second flat plate.

20 Claims, 17 Drawing Sheets

DISPLAY DEVICE

CROSS-REFERENCE TO RELATED APPLICATION

This application claims priority under 35 U.S.C. 119 to Korean Patent Application No. 10-2021-0169912, filed on Dec. 1, 2021 in the Korean Intellectual Property Office, the disclosure of which is incorporated by reference in its entirety herein.

TECHNICAL FIELD

The disclosure relates to a display device.

DISCUSSION OF RELATED ART

Display devices have become increasingly important with the development of multimedia technology and information. Various types of display devices have been developed, including an organic light emitting display device and a liquid crystal display device.

In recent years, research and development of a display device having a flexible display has been actively conducted. A flexible display may extend or reduce a display screen, such as by being folded, bent, or slid to decrease a volume of the display device or provide a change in design of the display device.

SUMMARY

Aspects of embodiments of the present disclosure provide a display device capable of preventing a display panel from being deformed when folded.

However, aspects of embodiments of the present disclosure are not restricted to those set forth herein. The above and other aspects of the present disclosure will become more apparent to one of ordinary skill in the art to which the present disclosure pertains by referencing the detailed description of embodiments given below.

The display device according to an embodiment of the present disclosure may prevent the display panel from being deformed when folded. However, the effects of embodiments of the present inventive disclosure are not restricted to the one set forth herein. The above and other effects of embodiments of the present disclosure will become more apparent to one of daily skill in the art to which embodiments pertain by referencing the claims.

According to an embodiment of the present disclosure, a display device includes a display panel including a first folding area that is foldable and a second folding area that is foldable. The second folding area is spaced apart from a first side of the first folding area in a first direction. A first non-folding area is disposed between the first folding area and the second folding area in the first direction. A second non-folding area is disposed on second side of the first non-folding area that is opposite to the first side. The first folding area is interposed between the first non-folding area and the second non-folding area in the first direction. A panel support is disposed on a lower side of the display panel. An adhesive member is interposed between the display panel and the panel support. The panel support includes a first lattice pattern overlapping the first folding area, a second lattice pattern overlapping the second folding area, a first flat plate overlapping the first non-folding area, and a second flat plate overlapping the second non-folding area. The adhesive member includes a first adhesive member disposed on the first flat plate and directly contacting the first flat plate. A second adhesive member is disposed on the second flat plate and directly contacts the second flat plate. An adhesive force between the first adhesive member and the first flat plate is greater than an adhesive force between the second adhesive member and the second flat plate.

In an embodiment, the panel support further includes a third flat plate disposed on a first side of the second lattice pattern in the first direction, the adhesive member further includes a third adhesive member disposed on the third flat plate and directly contacting the third flat plate, and the adhesive force between the first adhesive member and the first flat plate is greater than an adhesive force between the third adhesive member and the third flat plate.

In an embodiment, a modulus of the first adhesive member is greater than a modulus of the second adhesive member and a modulus of the third adhesive member.

In an embodiment, the first folding area of the display panel is folded with a first radius of curvature, and the second folding area of the display panel is folded with a second radius of curvature that is greater than the first radius of curvature, and the adhesive force between the second adhesive member and the second flat plate is greater than the adhesive force between the third adhesive member and the third flat plate.

In an embodiment, a width of a separation space that separates the first adhesive member and the second adhesive member is less than a width of a separation space that separates the first adhesive member and the third adhesive member.

In an embodiment, the first adhesive member, the second adhesive member, and the third adhesive member are spaced apart from each other, the first folding area overlaps a first separation space between the first adhesive member and the second adhesive member, and the second folding area overlaps a second separation space between the first adhesive member and the third adhesive member.

In an embodiment, the first lattice pattern overlaps the first separation space, and the second lattice pattern overlaps the second separation space.

In an embodiment, the display device further comprises a digitizer member disposed on a lower side of the panel support that includes: a first digitizer member overlapping the first adhesive member, a second digitizer member overlapping the second adhesive member, and a third digitizer member overlapping the third adhesive member, a third separation space between the first digitizer member and the second digitizer member overlaps the first separation space, and a fourth separation space between the first digitizer member and the third digitizer member overlaps the second separation space.

In an embodiment, the display device further comprises a metal support disposed between the panel support and the digitizer member, the metal support includes: a first metal support member overlapping the first adhesive member, a second metal support member overlapping the second adhesive member, and a third metal support member overlapping the third adhesive member, a fifth separation space between the first metal support member and the second metal support member overlaps the first separation space, and a sixth separation space between the first metal support member and the third metal support member overlaps the second separation space.

In an embodiment, the display device further comprises a panel lower member disposed between the display panel and the adhesive member, the panel lower member includes at least one of a light blocking portion for absorbing external light and a buffer portion for absorbing an external shock.

In an embodiment, a bottom surface of the panel lower member directly contacts the first adhesive member and the second adhesive member, and the first adhesive member and the second adhesive member are spaced apart from each other.

In an embodiment, an adhesive force between the first adhesive member and the panel lower member is greater than an adhesive force between the second adhesive member and the panel lower member.

In an embodiment, the first adhesive member and the second adhesive member each includes a pressure-sensitive adhesive, the pressure-sensitive adhesive included in the first adhesive member is different from the pressure-sensitive adhesive included in the second adhesive member.

In an embodiment, the first adhesive member and the second adhesive member include the same UV curable material.

According to an embodiment of the present disclosure, a display device includes a display panel including a first folding area that is foldable, a first non-folding area disposed on a first side of the first folding area in a first direction, and a second non-folding area disposed on a second side of the first non-folding area that is opposite to the first side, the first folding area is interposed between the first non-folding area and the second non-folding area in the first direction. A panel support is disposed on a lower side of the display panel. An adhesive member is interposed between the display panel and the panel support. The panel support includes a first lattice pattern overlapping the first folding area, a first flat plate overlapping the first non-folding area, and a second flat plate overlapping the second non-folding area. The adhesive member includes a first adhesive member disposed on the first flat plate and directly contacting the first flat plate, and a second adhesive member disposed on the second flat plate and directly contacting the second flat plate. A width of the first non-folding area is less than a width of the second non-folding area. A width of the first flat plate is less than a width of the second flat plate. An adhesive force between the first adhesive member and the first flat plate is greater than an adhesive force between the second adhesive member and the second flat plate.

In an embodiment, an area of the first non-folding area is less than an area of the second non-folding area.

In an embodiment, the display device further comprises a panel lower member disposed between the display panel and the adhesive member, the panel lower member includes at least one of a light blocking portion for absorbing external light and a buffer portion for absorbing an external shock.

In an embodiment, a bottom surface of the panel lower member directly contacts the first adhesive member and the second adhesive member, the first adhesive member and the second adhesive member are spaced apart from each other, and an adhesive force between the first adhesive member and the panel lower member is greater than an adhesive force between the second adhesive member and the panel lower member.

In an embodiment, a width of the first adhesive member in the first direction is less than a width of the second adhesive member in the first direction.

In an embodiment, the display device further comprises a digitizer member disposed on a lower side of the panel support, the digitizer member includes a first digitizer member overlapping the first adhesive member and a second digitizer member overlapping the second adhesive member, and a width of the first digitizer member in the first direction is less than a width of the second digitizer member in the first direction.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The present disclosure will now be described more fully hereinafter with reference to the accompanying drawings, in which embodiments thereof are shown. The present disclosure may, however, be embodied in different forms and should not be construed as limited to the embodiments set forth herein. Rather, these embodiments are provided so that the present disclosure will be thorough and complete, and will convey the scope of the present disclosure to those skilled in the art.

It will also be understood that when a layer is referred to as being "on"another layer or substrate, it can be directly on the other layer or substrate, or intervening layers may also be present. The same reference numbers indicate the same components throughout the specification.

It will be understood that, although the terms "first," "second,"etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
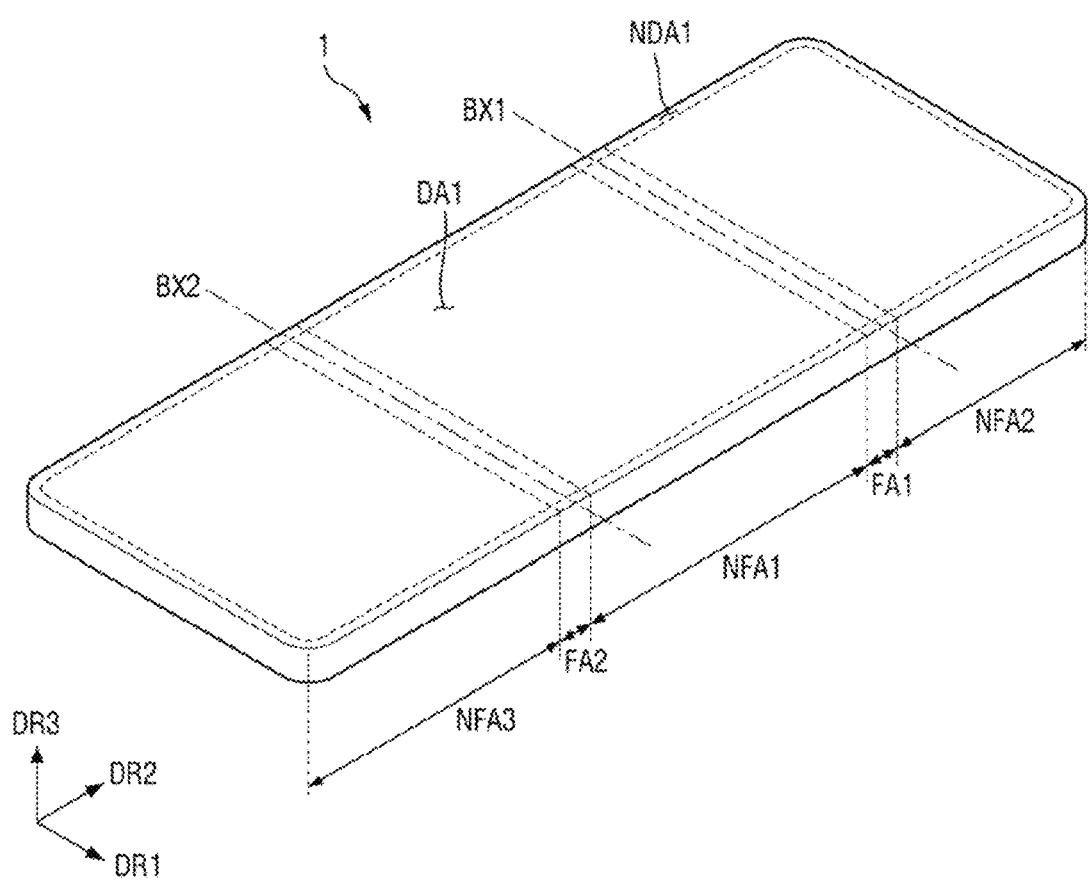
FIG. 1 is a perspective view illustrating a display device according to an embodiment of the present disclosure.
Figure 2:
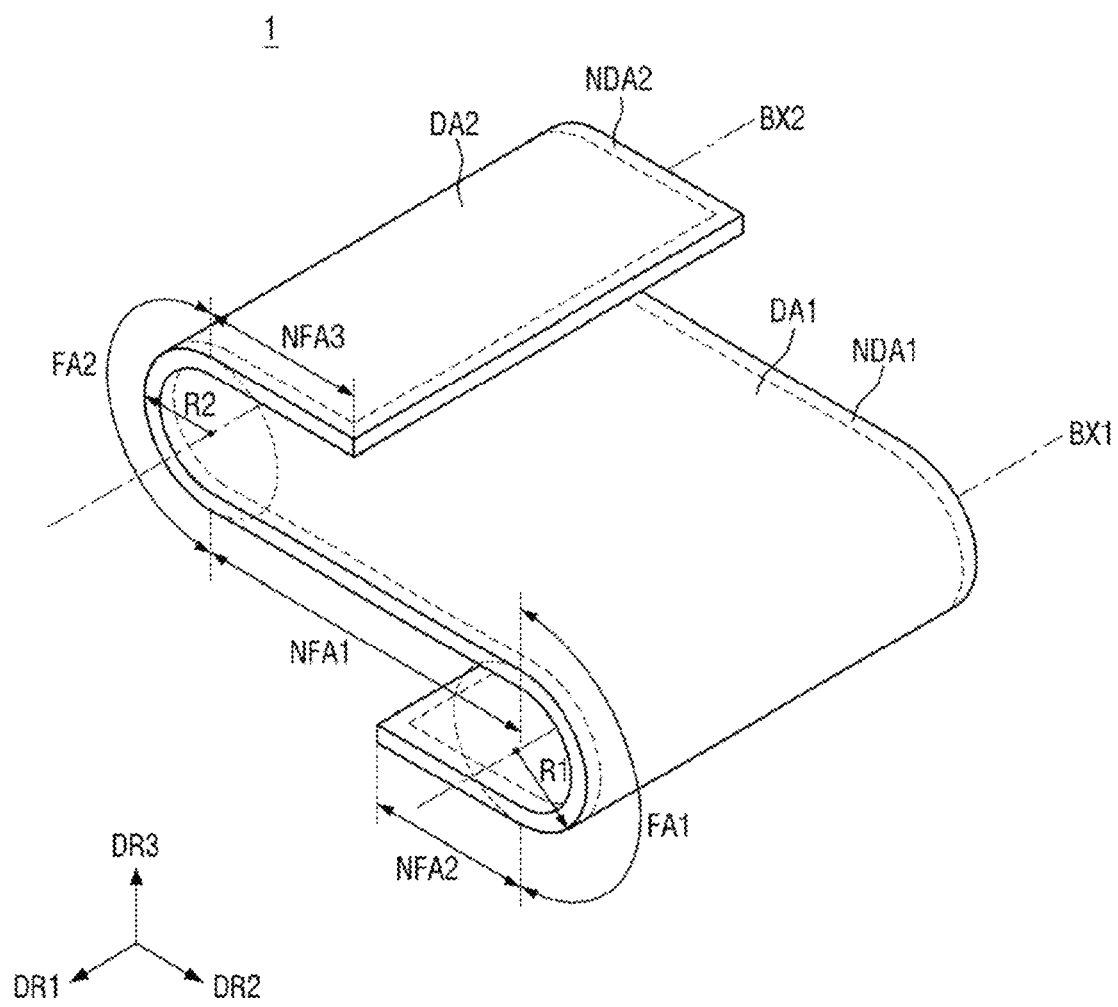
FIGS. 2 and 3 are perspective views illustrating a state in which the display device of FIG. 1 is folded according to embodiments of the present disclosure.
Figure 3:
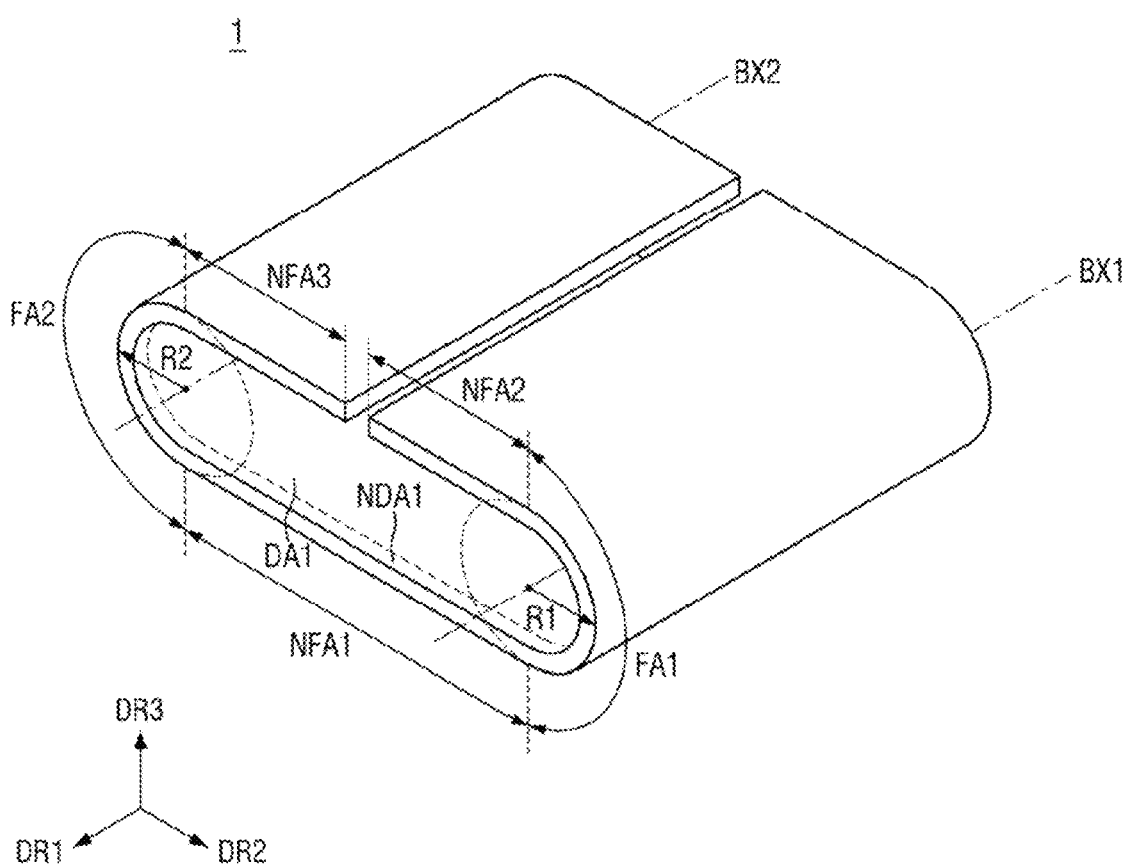

FIG. 1 is a perspective view illustrating a display device according to an embodiment. FIGS. 2 and 3 are perspective views illustrating a state in which the display device of FIG. 1 is folded.

Referring to FIGS. 1 to 3, a display device 1 according to an embodiment is a device that displays at least one moving image and/or still image, and may be used as a display screen of each of various products such as televisions, laptops, monitors, billboards, and Internet of Things, as well as portable electronic devices such as mobile phones, smart phones, tablet PCs, smart watches, watch phones, mobile communication terminals, electronic organizers, e-books, PMPs, navigation, UMPC, etc.

The display device 1 has a three-dimensional shape. In the drawings, a first direction DR1 refers to a direction parallel to a first side (e.g., a horizontal side) of the display device 1, a second direction DR2 refers to a direction parallel to a second side (e.g., a vertical side) of a display panel PNL, and a third direction DR3 refers to a thickness direction of the display device 1. In the following specification, unless otherwise specified, the term "direction"may refer to both directions toward both sides extending along the direction. In addition, when both "directions"extending to both sides need to be distinguished from each other, one side will be referred to as "one side in the direction" and the other side will be referred to as "the other side in the direction". In FIG. 1, an arrow direction will be referred to as one side, and an opposite direction to the arrow direction will be referred to as the other side. In an embodiment, a first direction DR1 and a second direction DR2 may be perpendicular to each other, the second direction DR2 and a third direction DR3 may be perpendicular to each other, and the first direction DR1 and the third direction DR3 may be perpendicular to each other. However, embodiments of the present disclosure are not necessarily limited thereto.

In some embodiments, a shape of the display device 1 in a plan view may have a rectangular shape such as a rectangle in which the horizontal side is shorter than the vertical side, as illustrated in FIG. 1, and each of the corners of the display device 1 may have a right-angled shape in a plan view or a rounded shape in a plan view. However, embodiments of the present disclosure are not necessarily limited thereto. For example, the shape of the display device 1 in a plan view may have a rectangular shape such as a rectangle in which the horizontal side is shorter than the vertical side.

The display device 1 according to an embodiment may be a multi-foldable display device in which a portion of the display device 1 may be folded based on a plurality of folding axes as illustrated in embodiments of FIGS. 2 and 3. In some embodiments, the number of folding axes may be two. However, embodiments of the present disclosure are not necessarily limited thereto. For example, the number of folding axes may be three or more. Hereinafter, for convenience of explanation, a description will be made based on a multi-foldable display device having two folding axes.

The display device 1 may include a first non-folding area NFA1, a second non-folding area NFA2, a third non-folding area NFA3, a first folding area FA1, and a second folding area FA2.

The first non-folding area NFA1, the second non-folding area NFA2, and the third non-folding area NFA3 may be normally flat portions that are not folded. The first non-folding area NFA1 may be disposed between the second non-folding area NFA2 and the third non-folding area NFA3 (e.g., in the second direction DR2) as a portion of the display device 1. For example, based on the first non-folding area NFA1, the second non-folding area NFA2 may be disposed on one side (e.g., a first side) of the first non-folding area NFA1 in a second direction DR2, and the third non-folding area NFA3 may be disposed on the other side (e.g., a second side that is opposite to the first side) of the first non-folding area NFA1 in the second direction DR2. The second non-folding area NFA2 may be a portion disposed outside one side of the display device 1 in the second direction DR2, the third non-folding area NFA3 may be a portion disposed outside the other side of the display device 1 in the second direction DR2.

In some embodiments, an area of a top surface of the display device 1 in the first non-folding area NFA1 may be larger than an area of a top surface of the display device 1 in the second non-folding area NFA2 and an area of a top surface of the display device 1 in the third non-folding area NFA3. However, embodiments of the present disclosure are not necessarily limited thereto. For example, in an embodiment, the area of the top surface of the display device 1 in the first non-folding area NFA1 may be substantially the same as the area of the top surface of the display device 1 in the second non-folding area NFA2 and the area of the top surface of the display device 1 in the third non-folding area NFA3.

The first folding area FA1 and the second folding area FA2 may be foldable areas. The first folding area FA1 may be disposed between the first non-folding area NFA1 and the second non-folding area NFA2 (e.g., in the second direction DR2). For example, the second non-folding area NFA2 may be disposed on one side (e.g., a first side) of the first folding area FA1 in the second direction DR2, and the first non-folding area NFA1 may be disposed on the other side (e.g., a second side that is opposite to the first side) of the first folding area FA1 in the second direction DR2. The second folding area FA2 may be disposed between the first non-folding area NFA1 and the third non-folding area NFA3 (e.g., in the second direction DR2). For example, the first non-folding area NFA1 may be disposed on one side (e.g., a first side) of the second folding area FA2 in the second direction DR2, and the third non-folding area NFA3 may be disposed on the other side (e.g., a second side that is opposite to the first side) of the second folding area FA2 in the second direction DR2.

The first non-folding area NFA1 and the second non-folding area NFA2 may be spaced apart from each other based on the first folding area FA1. The first non-folding area NFA1 and the third non-folding area NFA3 may be spaced apart from each other based on the second folding area FA2. The first folding area FA1 and the second folding area FA2 may be spaced apart from each other based on the first non-folding area NFA1. For example, the first folding area FA1 may be disposed on one side of the first non-folding area NFA1 in the second direction DR2, and the second folding area FA2 may be disposed on the other side of the first non-folding area NFA1 in the second direction DR2.

The first folding area FA1 may be folded based on a first folding axis BX1. The first folding area FA1 may overlap the first folding axis BX1 in the third direction DR3. In some embodiments, the first folding axis BX1 may be defined as a virtual axis parallel to the first direction DR1 on the first folding area FA1. However, embodiments of the present disclosure are not necessarily limited thereto. In some embodiments, the first folding axis BX1 may be positioned in the center of the first folding area FA1 in the second direction DR2. However, embodiments of the present disclosure are not necessarily limited thereto. The first folding area FA1 may be folded with a first radius of curvature R1 based on the first folding axis BX1 as illustrated in embodiments of FIGS. 2 and 3.

The second folding area FA2 may be folded based on a second folding axis BX2. In an embodiment, the second folding area FA2 may overlap the second folding axis BX2 in the third direction DR3. In some embodiments, the second folding axis BX2 may be defined as a virtual axis parallel to the first direction DR1 on the second folding area FA2. However, embodiments of the present disclosure are not necessarily limited thereto. In some embodiments, the second folding axis BX2 may be positioned in the center of the second folding area FA2 in the second direction DR2. However, embodiments of the present disclosure are not necessarily limited thereto. The second folding area FA2 may be folded with a second radius of curvature R2 based on the second folding axis BX2 as illustrated in FIGS. 2 and 3.

In some embodiments, widths of the first folding area FA1 and the second folding area FA2 in the second direction DR2 may be substantially the same. However, embodiments of the present disclosure are not necessarily limited thereto. For example, the widths of the first folding area FA1 and the second folding area FA2 in the second direction DR2 may be different from each other. Hereinafter, for convenience of explanation, an embodiment in which the widths of the first folding area FA1 and the second folding area FA2 in the second direction DR2 are substantially the same will be mainly described. In this embodiment, the first radius of curvature R1 and the second radius of curvature R2 may be substantially the same.

When the first folding area FA1 and the second folding area FA2 are not folded, the display device 1 may maintain an unfolded state (hereinafter referred to as a "first state") as illustrated in an embodiment of FIG. 1, and when the first folding area FA1 and the second folding area FA2 are folded, the display device 1 may maintain a folded state (hereinafter referred to as a "second state") as illustrated in embodiments of FIGS. 2 and 3. The display device 1 may be switched from the first state to the second state as the first folding area FA1 and the second folding area FA2 are folded. Accordingly, since a length of the display device 1 in the second direction DR2 may be reduced, it may be convenient for the user to carry the display device 1. A detailed description of the second state of the display device 1 will be described later.

In an embodiment, the first folding axis BX1 and the second folding axis BX2 may be spaced apart from each other in the second direction DR2. For example, the second folding axis BX2 may be disposed on the other side of the first folding axis BX1 in the second direction DR2. However, embodiments of the present disclosure are not necessarily limited thereto.

The display device 1 may include a display area and a non-display area.

The display area may be an area in which pixels are arranged to display a screen. The display area may include a first display area DA1 and a second display area DA2. The non-display area may be an area that does not display a screen. The non-display area may include a first non-display area NDA1 and a second non-display area NDA2. Referring to an embodiment of FIG. 1, in the first state of the display device 1, one side surface of the display device 1 in the third direction DR3 may be a top surface on which the first display area DA1 and the first non-display area NDA1 are disposed, and the other surface of the display device 1 in the third direction DR3 may be a bottom surface on which the second display area DA2 and the second non-display area NDA2 are disposed.

The first display area DA1 may be disposed on the top surface of the display device 1 as illustrated in an embodiment of FIG. 1 in the first state of the display device 1. In this embodiment, each of the first non-folding area NFA1, the second non-folding area NFA2, the third non-folding area NFA3, the first folding area FA1, and the second folding area FA2 may include at least a portion of the first display area DA1. A shape of the first display area DA1 in a plan view may follow a shape of the display device 1 in the first state in a plan view. For example, in an embodiment in which the shape of the display device 1 in the first state in a plan view is a rectangle, the shape of the first display area DA1 in a plan view may also be a rectangle.

The first non-display area NDA1 may be disposed around the first display area DA1 (e.g., in the first and second directions DR1, DR2). In this embodiment, each of the first non-folding area NFA1, the second non-folding area NFA2, the third non-folding area NFA3, the first folding area FA1, and the second folding area FA2 may include at least a portion of the first non-display area NDA1. In some embodiments, the first non-display area NDA1 may be disposed to completely surround the first display area DA1. However, embodiments of the present disclosure are not necessarily limited thereto. For example, the first display area DA1 may be partially surrounded by the first non-display area NDA1.

In an embodiment, the second display area DA2 may be disposed on the bottom surface of the display device 1 in the first state of the display device 1. In some embodiments, the second display area DA2 may be disposed only in the second non-folding area NFA2 and the third non-folding area NFA3. However, embodiments of the present disclosure are not necessarily limited thereto. The second display area DA2 may display a screen to the user when the display device 1 is in the second state.

The second non-display area NDA2 may be disposed around the second display area DA2 in the display device 1 in the first state. In this embodiment, each of the first non-folding area NFA1, the second non-folding area NFA2, the third non-folding area NFA3, the first folding area FA1, and the second folding area FA2 may include at least a portion of the second non-display area NDA2. In an embodiment, the second non-display area NDA2 may be disposed to surround the second display area DA2 (e.g., in the first and/or second directions DR1, DR2). However, embodiments of the present disclosure are not necessarily limited thereto. For example, the second display area DA2 may be partially surrounded by the second non-display area NDA2.

In some embodiments, the display device 1 may be folded in an out-folding manner in which a portion of the second display area DA2 on the second non-folding area NFA2 and a portion of the second display area DA2 on the first non-folding area NFA1 are folded to face each other, and a portion of the first display area DA1 on the third non-folding area NFA3 and a portion of the first display area DA1 on the first non-folding area NFA1 are folded to face each other in the second state as illustrated in an embodiment of FIG. 2. However, embodiments of the present disclosure are not necessarily limited thereto. For example, the display device 1 may be folded in an in-folding manner in which a portion of the first display area DA1 on the third non-folding area NFA3 and a portion of the first display area DA1 on the second non-folding area NFA2 are folded to face a portion of the first display area DA1 on the first non-folding area NFA1 in the second state as illustrated in FIG. 3.

As described above, the first folding area FA1 may be folded with a first radius of curvature R1 based on the first folding axis BX1, and the second folding area FA2 may be folded with a second radius of curvature R2 based on the second folding axis BX2. In some embodiments, the first radius of curvature R1 and the second radius of curvature R2 may be substantially the same. However, embodiments of the present disclosure are not necessarily limited thereto. In some embodiments, when the display device 1 is folded in the in-folding manner, an end of the third non-folding area NFA3 and an end of the second non-folding area NFA2 of the display device 1 may be in direct contact with each other. However, embodiments of the present disclosure are not necessarily limited thereto.

Hereinafter, a structure of the display device 1 will be described in detail.

Figure 4:
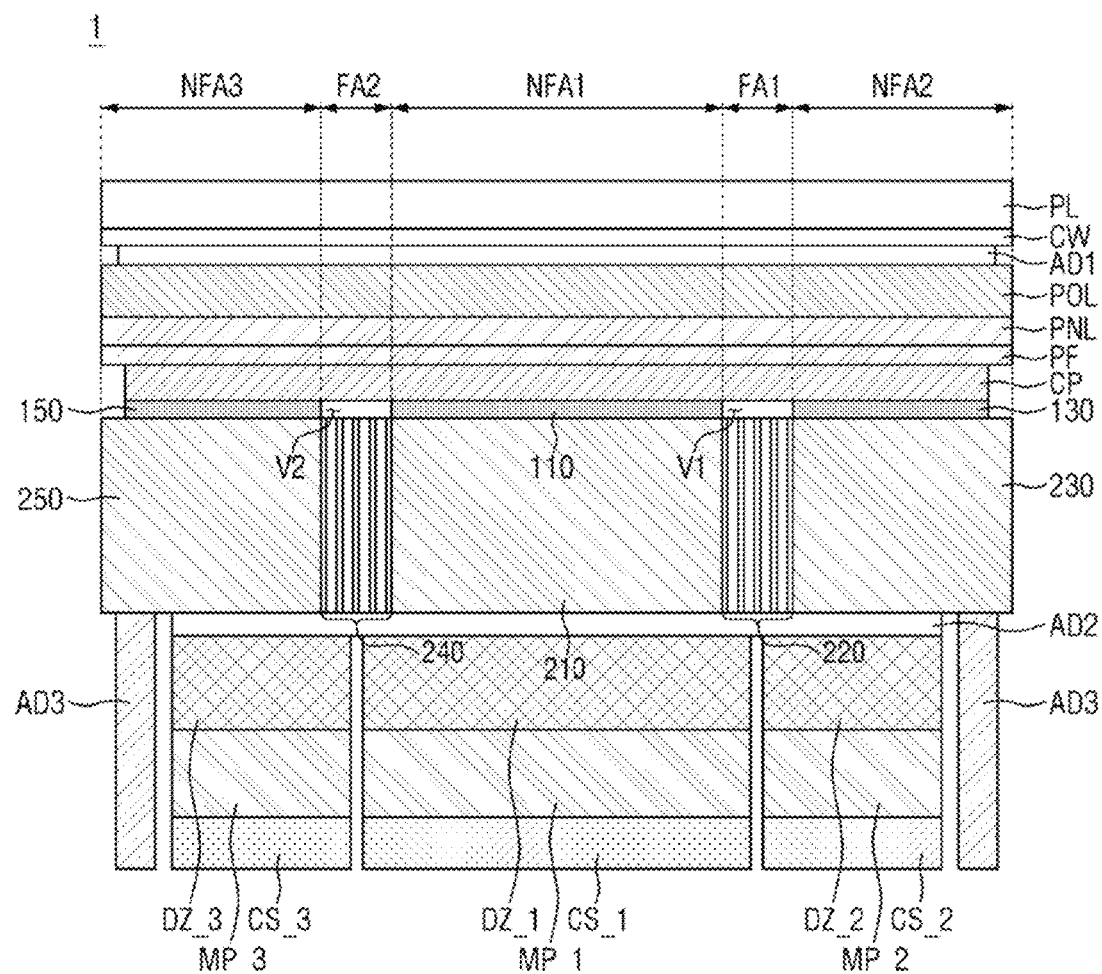
FIG. 4 is a side view schematically illustrating a structure of the display device FIG. 1 according to an embodiment of the present disclosure.

FIG. 4 is a side view schematically illustrating a structure of the display device of FIG. 1.

Referring to FIG. 4, the display device 1 according to an embodiment may include an upper protective film PL, a window CW, a first adhesive layer AD1, a polarizing member POL, a display panel PNL, a support film PF, a panel lower member CP, an adhesive member 100, a panel support 200, a second adhesive layer AD2, a digitizer DZ, a metal support MP, a buffer member CS, and a third adhesive layer AD3. In the present specification, based on one component, one side in the third direction DR3 may also be expressed as an upper portion and the other side in the third direction DR3 may also be expressed as a lower portion.

In an embodiment, the first non-folding area NFA1, the second non-folding area NFA2, the third non-folding area NFA3, the first folding area FA1, and the second folding area FA2 of the display device 1 may be equally applied to each component of the display device 1 described above, that is, the upper protective film PL, the window CW, the first adhesive layer AD1, the polarizing member POL, the display panel PNL, the support film PF, the panel lower member CP, the adhesive member 100, the panel support 200, the second adhesive layer AD2, the digitizer DZ, the metal support MP, and the buffer member CS.

In an embodiment, the upper protective film PL may perform at least one of scattering prevention, shock absorption, engraving, prevention, fingerprint prevention, and glare prevention of the window CW, which will be described later. The upper protective film PL may be disposed on one side surface (hereinafter, referred to as "top surface") of the window CW in the third direction DR3. The upper protective film PL may be adhered to a front surface of the window CW through an adhesive member such as a pressure-sensitive adhesive.

The window CW may protect the display panel PNL, which will be described later, from the outside, such as from external impacts and environmental contaminants. The window CW may be disposed on one side surface of the polarizing member POL in the third direction DR3. The window CW is made of a transparent material, and may be, for example, glass or plastic. In an embodiment, the window CW may be an ultra-thin glass or a transparent polyimide film having a width (hereinafter referred to as a "thickness") in a range of about 0.3 mm or less in the third direction DR3.

The window CW may be adhered to a front surface of the polarizing member POL by a first adhesive member. The first adhesive member may be a transparent adhesive film or a transparent adhesive resin.

The polarizing member POL may polarize light emitted from the display panel PNL or to polarize light incident to the display panel PNL. The polarizing member POL may be disposed on one side surface (hereinafter, referred to as a "top surface") of the display panel PNL in the third direction DR3. However, embodiments of the present disclosure are not necessarily limited thereto.

For example, the polarizing member POL may be omitted in some embodiments. In an embodiment in which the polarizing member POL is omitted, the window CW may be adhered to the front surface of the display panel PNL by the first adhesive member.

The display panel PNL is a panel that displays a screen. The display panel PNL may be any type of display panel such as an organic light emitting display panel including an organic emission layer, a micro light emitting diode (LED) display panel using a micro light emitting diode, a quantum dot light emitting display panel using a quantum dot light emitting diode including a quantum dot emission layer, and an inorganic light emitting display panel using an inorganic light emitting element including an inorganic semiconductor.

Referring to an embodiment of FIG. 4, the display panel PNL may display a screen on one side thereof in the third direction DR3.

In an embodiment, one area of the display panel PNL disposed in the first non-folding area NFA1 of the display device 1 may be the first non-folding area NFA1 of the display panel PNL, one area of the display panel PNL disposed in the second non-folding area NFA2 of the display device 1 may be the second non-folding area NFA2 of the display panel PNL, one area of the display panel PNL disposed in the third non-folding area NFA3 of the display device 1 may be the third non-folding area NFA3 of the display panel PNL, one area of the display panel PNL disposed in the first folding area FA1 of the display device 1 may be the first folding area FA1 of the display panel PNL, and one area of the display panel PNL disposed in the second folding area FA2 of the display device 1 may be the second folding area FA2 of the display panel PNL.

For example, the first folding area FA1 of the display panel PNL may overlap (e.g., in the third direction DR3) a first separation space V1, a first lattice pattern 220, a space between a first digitizer member DZ_1 and a second digitizer member DZ_2 and a space between a first metal support member MP_1 and a second metal support member MP_2 to be described later in a third direction DR3, and the second folding area FA2 of the display panel PNL may overlap (e.g., in the third direction DR3) a second separation space V2, a second lattice pattern 240, a space between the first digitizer member DZ_1 and a third digitizer member DZ_3 and a space between the first metal support member MP_1 and a third metal support member MP_3 to be described later in a third direction DR3.

The support film PF may support the display panel PNL and protect a rear surface of the display panel PNL. The support film PF may be disposed on the other side surface (hereinafter, referred to as a "bottom surface") of the display panel PNL in the third direction DR3. In an embodiment, the support film PF may be a plastic such as polyethylene terephthalate or polyimide. FIG. 4 illustrates that the support film PF is also disposed on a first folding portion of the display device 1. However, embodiments of the present disclosure are not necessarily limited thereto. For example, the support film PF may be removed from (e.g., not disposed in) the first folding area FA1 and the second folding area FA2 of the display device 1 so that the display device 1 is smoothly folded.

The panel lower member CP may be disposed on the other side surface (hereinafter, referred to as a "rear surface") of the support film PF in the third direction DR3. In an embodiment, the panel lower member CP may include at least one of a light blocking portion for absorbing light incident from the outside, a buffer portion for absorbing a shock from the outside, and a heat dissipation portion for efficiently dissipating heat of the display panel PNL.

The light blocking portion blocks transmission of light to prevent components disposed on the lower side of the panel lower member CP, for example, the digitizer DZ and the like which will be described later, from being viewed from the front of the display panel PNL. In an embodiment, the light blocking portion may include a light absorbing material such as a black pigment or a black dye.

The buffer portion absorbs the external shock to prevent damage to the display panel PNL. The buffer portion may be formed as a single layer or a plurality of layers. For example, in an embodiment, the buffer portion may be formed of a polymer resin such as polyurethane, polycarbonate, polypropylene, or polyethylene or may include a material having elasticity, such as a sponge formed by foaming rubber, a urethane based material, or an acrylic-based material.

The heat dissipation portion may include a first heat dissipation layer including graphite or carbon nanotubes, and a second heat dissipation layer formed of a thin metal film such as copper, nickel, ferrite, or silver that may shield electromagnetic waves and has excellent thermal conductivity.

The panel support 200 may support the rear surface of the display panel PNL. The panel support 200 may be disposed on the other side surface (hereinafter, referred to as a "bottom surface") of the panel lower member CP in the third direction DR3. The panel support 200 may be a rigid member having a shape or volume that is not easily changed by external pressure. In some embodiments, the panel support 200 may include a metal. However, embodiments of the present disclosure are not necessarily limited thereto.

The panel support 200 may include a first flat plate 210 disposed in the first non-folding area NFA1 of the display device 1 so that the display device 1 is not deformed by an external force in the first non-folding area NFA1, include a second flat plate 230 disposed in the second non-folding area NFA2 of the display device 1 so that the display device 1 is not deformed by an external force in the second non-folding area NFA2, and include a third flat plate 250 disposed in the third non-folding area NFA3 of the display device 1 so that the display device 1 is not deformed by an external force in the third non-folding area NFA3.

The first flat plate 210 may be disposed between the second flat plate 230 and the third flat plate 250 (e.g., in the second direction DR2). For example, the second flat plate 230 may be disposed on one side of the first flat plate 210 in the second direction DR2, and the third flat plate 250 may be disposed on the other side of the first flat plate 210 in the second direction DR2.

The first flat plate 210, the second flat plate 230, and the third flat plate 250 may have a flat plate shape in which a shape of a top surface in a plan view is a rectangle. In some embodiments, an area of the top surface of the first flat plate 210 may be greater than an area of the top surface of the second flat plate 230 and an area of the top surface of the third flat plate 250. However, embodiments of the present disclosure are not necessarily limited thereto. For example, in an embodiment, the area of the top surface of the first flat plate 210 may be substantially the same as the area of the top surface of the second flat plate 230 and the area of the top surface of the third flat plate 250.

The panel support 200 may include a first lattice pattern 220 disposed in the first folding area FA1 of the display device 1 so that the display device 1 is easily bent in the first folding area FA1, and include a second lattice pattern 240 disposed in the second folding area FA2 of the display device 1 so that the display device 1 is easily bent in the second folding area FA2.

The first lattice pattern 220 may be disposed between the first flat plate 210 and the second flat plate 230 (e.g., in the second direction DR2), and the second lattice pattern 240 may be disposed between the first flat plate 210 and the third flat plate 250 (e.g., in the second direction DR2). The first lattice pattern 220 may overlap the first folding axis BX1 in the third direction DR3. The second lattice pattern 240 may overlap the second folding axis BX2 in the third direction DR3. In some embodiments, the first folding axis BX1 may be positioned in the center of the first lattice pattern 220 and the second folding axis BX2 may be positioned in the center of the second lattice pattern 240. However, embodiments of the present disclosure are not necessarily limited thereto.

Figure 5:
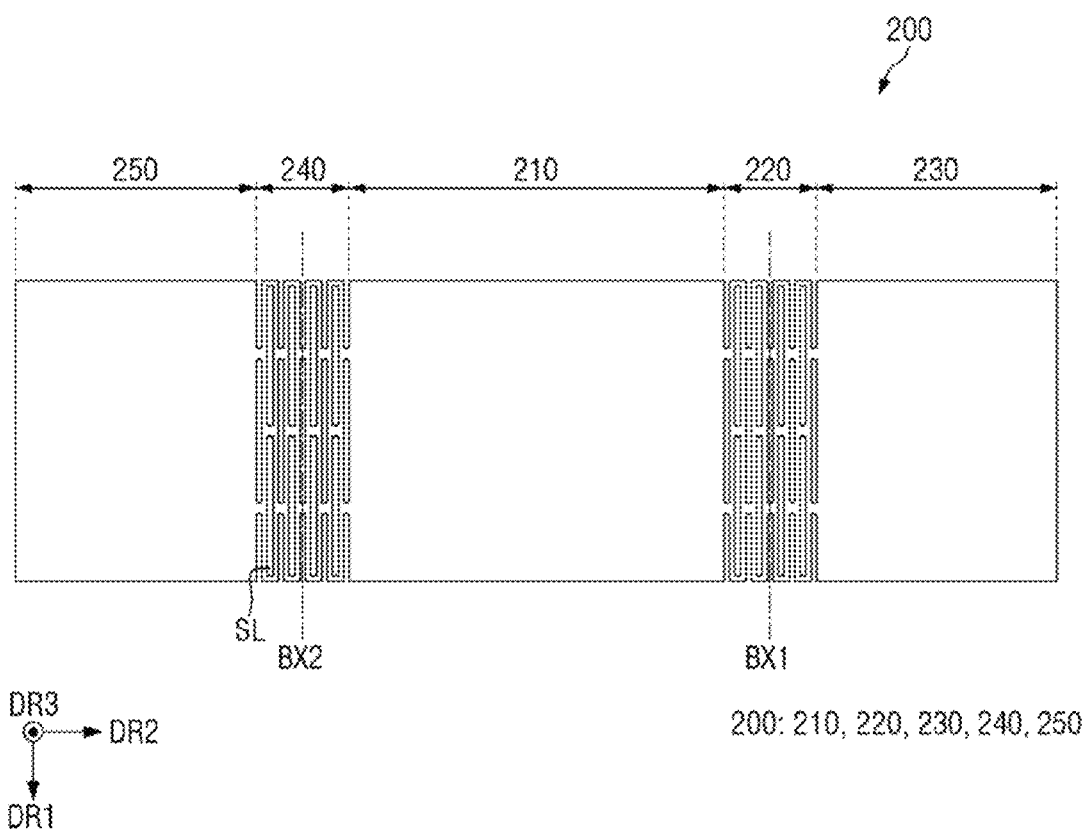
FIG. 5 is a plan view illustrating a top surface of a panel support of a display device according to an embodiment of the present disclosure.

As illustrated in an embodiment of FIG. 5, the first lattice pattern 220 and the second lattice pattern 240 may include a plurality of slits SL penetrating through the panel support 200 in the third direction DR3. Each of the plurality of slits SL may be spaced apart from each other to form a lattice pattern. The first lattice pattern 220 and the second lattice pattern 240 may be easily folded by the plurality of slits SL. For example, when the display device 1 is moved from the first state to the second state, the plurality of slits SL extend in the second direction DR2, such that the first lattice pattern 220 and the second lattice pattern 240 may be extended in the second direction DR2 to be easily folded.

In an embodiment, a width of the first lattice pattern 220 in the second direction DR2 may be substantially the same as a width of the first folding area FA1 of the display device 1 in the second direction DR2. A width of the second lattice pattern 240 in the second direction DR2 may be substantially the same as a width of the second folding area FA2 of the display device 1 in the second direction DR2. Accordingly, in an embodiment in which the width of the first folding area FA1 in the second direction DR2 is substantially the same as the width of the second folding area FA2 in the second direction DR2, the width of the first lattice pattern 220 in the second direction DR2, and the width of the second lattice pattern 240 in the second direction DR2 may be substantially the same.

The adhesive member 100 may adhere the panel lower member CP and the panel support 200 to each other. The adhesive member 100 may be interposed between the panel lower member CP and the panel support 200 (e.g., in the third direction DR3). For example, the adhesive member 100 may be in direct contact with the bottom surface of the panel lower member CP and may be in direct contact with the top surface of the panel support 200. Accordingly, the adhesive member 100 may adhere the bottom surface of the panel lower member CP to the top surface of the panel support 200.

The adhesive member 100 may include a first adhesive member 110 disposed on the first flat plate 210 (e.g., disposed directly thereon in the third direction DR3), a second adhesive member 130 disposed on the second flat plate 230 (e.g., disposed directly thereon in the third direction DR3), and a third adhesive member 150 disposed on the third flat plate 250 (e.g., disposed directly thereon in the third direction DR3). The first adhesive member 110 may be disposed between the second adhesive member 130 and the third adhesive member 150 (e.g., in the second direction DR2). For example, the second adhesive member 130 may be disposed on one side of the first adhesive member 110 in the second direction DR2, and the third adhesive member 150 may be disposed on the other side of the first adhesive member 110 in the second direction DR2.

The first adhesive member 110, the second adhesive member 130, and the third adhesive member 150 may be disposed to be discrete and spaced apart from each other in the second direction DR2. For example, in an embodiment, the first adhesive member 110, the second adhesive member 130, and the third adhesive member 150 may not overlap the first lattice pattern 220 and the second lattice pattern 240 in the third direction DR3. For example, a first separation space V1 overlapping with the first lattice pattern 220 in the third direction DR3 may be disposed between the first adhesive member 110 and the second adhesive member 130 (e.g., in the second direction DR2), and a second separation space V2 overlapping the second lattice pattern 240 in the third direction DR3 may be disposed between the first adhesive member 110 and the third adhesive member 150 (e.g., in the second direction DR2). The first separation space V1 may be disposed in the first folding area FA1 of the display device 1, and the second separation space V2 may be disposed in the second folding area FA2 of the display device 1.

In some embodiments, a width of the first adhesive member 110 in the second direction DR2 may be substantially the same as a width of the first flat plate 210 in the second direction DR2, a width of the second adhesive member 130 in the second direction DR2 may be substantially the same as a width of the second flat plate 230 in the second direction DR2, and a width of the third adhesive member 150 in the second direction DR2 may be substantially the same as a width of the third flat plate 250 in the second direction DR2. However, embodiments of the present disclosure are not necessarily limited thereto. For example, in an embodiment, the width of the first adhesive member 110 in the second direction DR2 may be less than the width of the first flat plate 210 in the second direction DR2, the width of the second adhesive member 130 in the second direction DR2 may be less than the width of the second flat plate 230 in the second direction DR2, and the width of the third adhesive member 150 in the second direction DR2 may be less than the width of the third flat plate 250 in the second direction DR2.

In an embodiment, the adhesive member 100 may include a pressure sensitive adhesive (PSA) or a UV curable material. An adhesive force or modulus of the adhesive member 100 may be different in the first adhesive member 110, the second adhesive member 130, and the third adhesive member 150. A detailed description thereof will be provided below.

The digitizer DZ may determine a touch coordinate by detecting a magnetic field or electromagnetic signal emitted from an electronic pen or the like. The digitizer DZ may be disposed on a lower side of the panel support 200 (e.g., in the third direction DR3). For example, the digitizer DZ may be adhered to the bottom surface of the panel support 200 by the second adhesive layer AD2 interposed between the panel support 200 and the digitizer DZ (e.g., in the third direction DR3).

In an embodiment, the digitizer DZ may include a first digitizer member DZ_1, a second digitizer member DZ_2, and a third digitizer member DZ_3. The first digitizer member DZ_1, the second digitizer member DZ_2, and the third digitizer member DZ_3 may be disposed on the bottom surface of the panel support 200. The first digitizer member DZ_1, the second digitizer member DZ_2, and the third digitizer member DZ_3 may be adhered to the bottom surface of the panel support 200 by the second adhesive layer AD2 as described above. In some embodiments, the second adhesive member may be a pressure-sensitive adhesive. However, embodiments of the present disclosure are not necessarily limited thereto.

The first digitizer member DZ_1 may be disposed between the second digitizer member DZ_2 and the third digitizer member DZ_3 (e.g., in the second direction DR2). For example, the second digitizer member DZ_2 may be disposed on one side of the first digitizer member DZ_1 in the second direction DR2, and the third digitizer member DZ_3 may be disposed on the other side of the first digitizer member DZ_1 in the second direction DR2. The first digitizer member DZ_1 may be disposed in the first non-folding area NFA1 of the display device 1, the second digitizer member DZ_2 may be disposed in the second non-folding area NFA2 of the display device 1, the third digitizer member DZ_3 may be disposed in the third non-folding area NFA3 of the display device 1. Accordingly, the first digitizer member DZ_1 may overlap the first adhesive member 110 in the third direction DR3, the second digitizer member DZ_2 may overlap the second adhesive member 130 in the third direction DR3, and the third digitizer member DZ_3 may overlap the third adhesive member 150 in the third direction DR3.

The first digitizer member DZ_1, the second digitizer member DZ_2, and the third digitizer member DZ_3 may be spaced apart from each other. For example, in an embodiment the first digitizer member DZ_1, the second digitizer member DZ_2, and the third digitizer member DZ_3 may not be disposed in at least a portion of the first folding area FA1 and the second folding area FA2 to reduce a folding stress of the display device 1. A separation space between the first digitizer member DZ_1 and the second digitizer member DZ_2 may overlap the first separation space V1 disposed between the first adhesive member 110 and the second adhesive member 130 in the third direction DR3, and a separation space between the first digitizer member DZ_1 and the third digitizer member DZ_3 may overlap the second separation space V2 disposed between the first adhesive member 110 and the third adhesive member 150 in the third direction DR3.

In an embodiment, the separation space between the first digitizer member DZ_1 and the second digitizer member DZ_2 may be disposed in the first folding area FA1 and may be less than a width of the first separation space V1 in the second direction DR2. The separation space between the first digitizer member DZ_1 and the third digitizer member DZ_3 may be disposed in the second folding area FA2 and may be less than a width of the second separation space V2 in the second direction DR2. Therefore, a portion of the first digitizer member DZ_1 and the second digitizer member DZ_2 may overlap the first folding area FA1 and a portion of the first digitizer member DZ_1 and the third digitizer member DZ_3 may overlap the second folding area FA2.

The first digitizer member DZ_1, the second digitizer member DZ_2, and the third digitizer member DZ_3 may include electrode patterns for detecting an approach or contact of an electronic pen such as a stylus pen supporting an electromagnetic induction method. The first digitizer member DZ_1, the second digitizer member DZ_2, and the third digitizer member DZ_3 may detect a magnetic field or electromagnetic signal emitted from the electronic pen based on the electrode patterns, and may determine a point where the detected magnetic field or electromagnetic signal is greatest as the touch coordinate.

Magnetic metal powder may be disposed on a bottom surface of the first digitizer member DZ_1, a bottom surface of the second digitizer member DZ_2, and a bottom surface of the third digitizer member DZ_3. In this embodiment, the magnetic field or electromagnetic signal passing through the bottom surface of the first digitizer member DZ_1, the bottom surface of the second digitizer member DZ_2, and the bottom surface of the third digitizer member DZ_3 may flow into the magnetic metal powder. Therefore, due to the magnetic metal powder, emission of the magnetic field or electromagnetic signal of the bottom surface of the first digitizer member DZ_1, the bottom surface of the second digitizer member DZ_2, and the bottom surface of the third digitizer member DZ_3 to the bottom surface of the display device 1 may be reduced.

The metal support MP may support the digitizer DZ. The metal support MP may be disposed on a lower side of the digitizer DZ. The metal support MP may include a material having high rigidity. For example, in an embodiment the metal support MP may include stainless steel such as SUS316.

The metal support MP may include a first metal support member MP_1, a second metal support member MP_2, and a third metal support member MP_3.

The first metal support member MP_1 may be disposed between the second metal support member MP_2 and the third metal support member MP_3 (e.g., in the second direction DR2). For example, the second metal support member MP_2 may be disposed on one side of the first metal support member MP_1 in the second direction DR2, and the third metal support member MP_3 may be disposed on the other side of the first metal support member MP_1 in the second direction DR2. The first metal support member MP_1 may be disposed on the bottom surface of the first digitizer member DZ_1, the second metal support member MP_2 may be disposed on the bottom surface of the second digitizer member DZ_2, and the third metal support member MP_3 may be disposed on the bottom surface of the third digitizer member DZ_3. Accordingly, the first metal support member MP_1 may overlap the first adhesive member 110 in the third direction DR3, the second metal support member MP_2 may overlap the second adhesive member 130 in the third direction DR3, and the third metal support member MP_3 may overlap the third adhesive member 150 in the third direction DR3.

The first metal support member MP_1, the second metal support member MP_2, and the third metal support member MP_3 may be spaced apart from each other. For example, in an embodiment, the first metal support member MP_1, the second metal support member MP_2, and the third metal support member MP_3 may not be disposed in at least a portion of the first folding area FA1 and the second folding area FA2 to reduce a folding stress of the display device 1. A separation space between the first metal support member MP_1 and the second metal support member MP_2 may overlap the first separation space V1 disposed between the first adhesive member 110 and the second adhesive member 130 in the third direction DR3, and a separation space between the first metal support member MP_1 and the third metal support member MP_3 may overlap the second separation space V2 disposed between the first adhesive member 110 and the third adhesive member 150 in the third direction DR3.

The separation space between the first metal support member MP_1 and the second metal support member MP_2 may be disposed in the first folding area FA1 and may be less than a width of the first separation space V1 in the second direction DR2. The separation space between the first metal support member MP_1 and the third metal support member MP_3 may be disposed in the second folding area FA2 and may be less than a width of the second separation space V2 in the second direction DR2. Therefore, a portion of the first metal support member MP_1 and the second metal support member MP_2 may overlap the first folding area FA1 and a portion of the first metal support member MP_1 and the third metal support member MP_3 may overlap the second folding area FA2.

The buffer member CS may prevent the panel support 200 and the digitizer DZ from being damaged by absorbing an external shock. The buffer member CS may be disposed on a lower side of the metal support MP. In an embodiment, the buffer member CS may include a material having elasticity, such as a sponge formed by foaming rubber, a urethane-based material, or an acrylic-based material.

The buffer member CS may include a first buffer member CS_1, a second buffer member CS_2, and a third buffer member CS_3.

The first buffer member CS_1 may be disposed between the second buffer member CS_2 and the third buffer member CS_3 (e.g., in the second direction DR2). For example, the second buffer member CS_2 may be disposed on one side of the first buffer member CS_1 in the second direction DR2, and the third buffer member CS_3 may be disposed on the other side of the first buffer member CS_1 in the second direction DR2. The first buffer member CS_1 may be disposed on a bottom surface of the first metal support member MP_1, the second buffer member CS_2 may be disposed on a bottom surface of the second metal support member MP_2, and the third buffer member CS_3 may be disposed on a bottom surface of the third metal support member MP_3. Accordingly, the first buffer member CS_1 may overlap the first adhesive member 110 in the third direction DR3, the second buffer member CS_2 may overlap the second adhesive member 130 in the third direction DR3, and the third buffer member CS_3 may overlap the third adhesive member 150 in the third direction DR3.

The first buffer member CS_1, the second buffer member CS_2, and the third buffer member CS_3 may be spaced apart from each other. For example, at least a portion of the first buffer member CS_1, the second buffer member CS_2, and the third buffer member CS_3 may not be disposed in the first folding area FA1 and the second folding area FA2 to reduce a folding stress of the display device 1. A separation space between the first buffer member CS_1 and the second buffer member CS_2 may overlap the first separation space V1 disposed between the first adhesive member 110 and the second adhesive member 130 in the third direction DR3, and a separation space between the first buffer member CS_1 and the third buffer member CS_3 may overlap the second separation space V2 disposed between the first adhesive member 110 and the third adhesive member 150 in the third direction DR3.

The separation space between the first buffer member CS_1 and the second buffer member CS_2 may be disposed in the first folding area FA1 and may be less than a width of the first separation space V1 in the second direction DR2. The separation space between the first buffer member CS_1 and the third buffer member CS_3 may be disposed in the second folding area FA2 and may be less than a width of the second separation space V2 in the second direction DR2. Therefore, a portion of the first butler member CS_1 and the second buffer member CS_2 may overlap the first folding area FA1 and a portion of the first buffer member CS_1 and the third buffer member CS_3 may overlap the second folding area FA2.

The third adhesive layer AD3 may prevent moisture or dust from penetrating into the display device 1. The third adhesive layer AD3 may be adhered to the bottom surface of the panel support 200. In an embodiment, the third adhesive layer AD3 may be adhered to both ends, e.g., edges, in the second direction DR2 on the bottom surface of the panel support 200 to cover the digitizer DZ, the metal support MP, and the buffer member CS.

Hereinafter, the panel support 200 and the adhesive member 100 adhered onto the panel support 200 will be described in detail.

Figure 6:
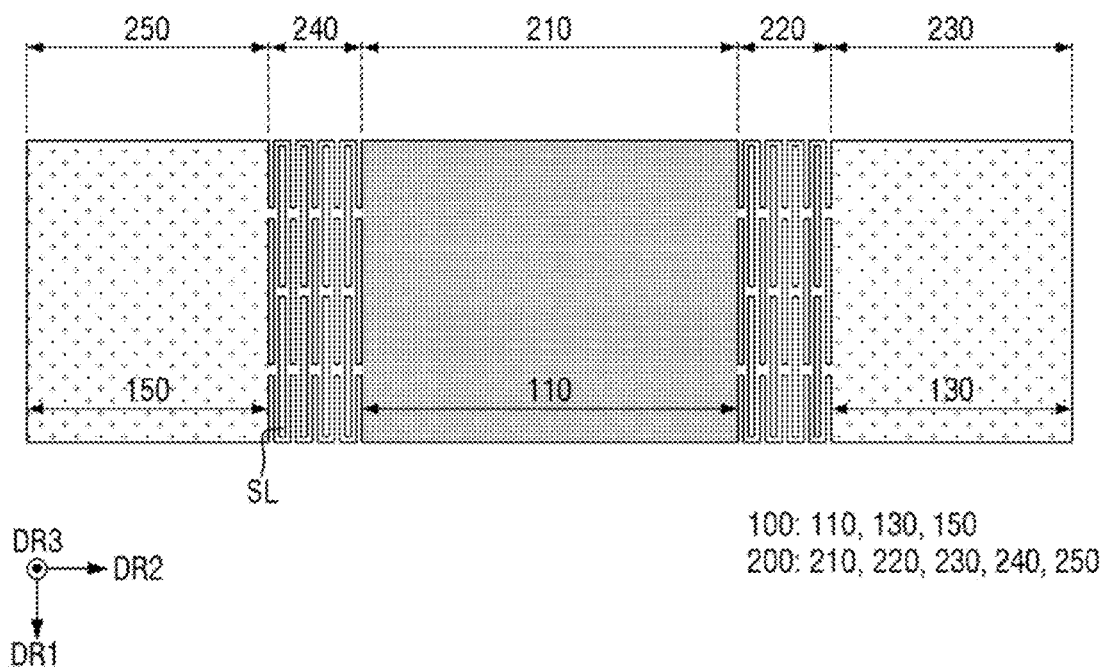
FIG. 6 is a plan view illustrating an adhesive member disposed on the top surface of the panel support of FIG. 5 according to an embodiment of the present disclosure.
Figure 7:
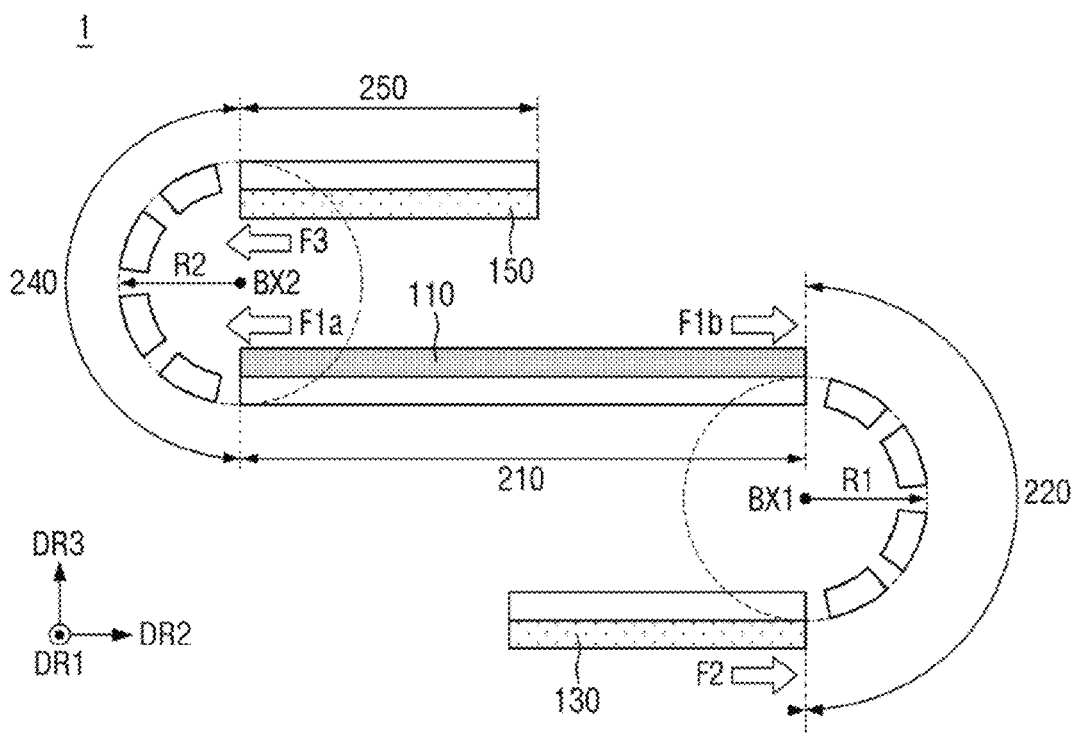
FIG. 7 is a side view illustrating a stress applied to an adhesive member disposed on a top surface of a panel support in a state in which the display device of FIG. 1 is folded according to an embodiment of the present disclosure.

FIG. 5 is a plan view illustrating a top surface of a panel support of a display device according to an embodiment. FIG. 6 is a plan view illustrating an adhesive member disposed on the top surface of the panel support of FIG. 5. FIG. 7 is a side view illustrating a stress applied to an adhesive member disposed on a top surface of a panel support in a state in which the display device of FIG. 1 is folded.

Referring to FIGS. 5 and 6, the adhesive member 100 may be disposed on the top surface of the panel support 200 to be in direct contact with the panel support 200. For example, the first adhesive member 110 is disposed on the top surface of the first flat plate 210 of the panel support 200 so that the first flat plate 210 and the first adhesive member 110 may be in direct contact with each other, the second adhesive member 130 is disposed on the top surface of the second flat plate 230 so that the second flat plate 230 and the second adhesive member 130 may be in direct contact with each other, and the third adhesive member 150 is disposed on the top surface of the third flat plate 250 so that the third flat plate 250 and the third adhesive member 150 may be in direct contact with each other.

In some embodiments, a width of the first flat plate 210 in the second direction DR2 may be greater than a width of the second flat plate 230 in the second direction DR2 and a width of the third flat plate 250 in the second direction DR2. However, embodiments of the present disclosure are not necessarily limited thereto. For example, the width of the first flat plate 210 in the second direction DR2 may be substantially the same as the width of the second flat plate 230 in the second direction DR2 and the width of the third flat plate 250 in the second direction DR2.

In some embodiments, the first adhesive member 110 may be formed to cover the entirety of the first flat plate 210, the second adhesive member 130 may be formed to cover the entirety of the second flat plate 230, and the third adhesive member 150 may be formed to cover the entirety of the third flat plate 250. However, embodiments of the present disclosure are not necessarily limited thereto. For example, in an embodiment the first adhesive member 110 may also be formed to cover only a portion of the first flat plate 210, the second adhesive member 130 may also be formed to cover only a portion of the second flat plate 230, and the third adhesive member 150 may also be formed to cover only a portion of the third flat plate 250.

In an embodiment, the first adhesive member 110, the second adhesive member 130, and the third adhesive member 150 may not overlap the first lattice pattern 220 and the second lattice pattern 240 (e.g., in the third direction DR3). For example, when viewed in the third direction DR3, the first adhesive member 110 and the second adhesive member 130 may be spaced apart from each other with the first lattice pattern 220 interposed therebetween, and the first adhesive member 110 and the third adhesive member 150 may be spaced apart from each other with the third lattice pattern interposed therebetween. Accordingly, the panel support 200 may be easily folded without being disturbed by the adhesive member 100 in the first lattice pattern 220 and the second lattice pattern 240.

In an embodiment, the adhesive member 100 may have an adhesive force or modulus within a predetermined range. The modulus described herein may mean a ratio between a shear modulus, such as a shearing stress that deforms an object in a transverse direction (e.g., the second direction DR2) and a shearing strain generated due to the shearing stress. A stress described herein may be a shearing stress.

In addition, the adhesive force described herein may mean a force required to separate the adhesive member 100 and an object to which the adhesive member 100 is attached. For example, the adhesive force described herein means an adhesive force between the adhesive member 100 and the panel support 200 or an adhesive force between the adhesive member 100 and the panel lower member. For example, an adhesive force of the first adhesive member 110 may mean an adhesive force between the first adhesive member 110 and the first flat plate 210 or an adhesive force between the first adhesive member 110 and the panel lower member CP, an adhesive force of the second adhesive member 130 may mean an adhesive force between the second adhesive member 130 and the second flat plate 230 or an adhesive force between the second adhesive member 130 and the panel lower member CP, and an adhesive force of the third adhesive member 150 may mean an adhesive force between the third adhesive member 150 and the third flat plate 250 or an adhesive force between the third adhesive member 150 and the panel lower member CP.

Accordingly, a high adhesive force of the adhesive member 100 may mean that it is difficult to separate the adhesive member 100 and the panel support 200 or the adhesive member 100 and the panel lower member, and a high modulus of the adhesive member 100 may mean that an external shape of the adhesive member 100 is not easily changed. The adhesive force and the modulus may generally have a proportional relationship with each other. For example, when the adhesive force is increased, the modulus may also be increased.

As the adhesive force of the adhesive member 100 is lowered, the display device 1 may be easily folded, but the adhesive member 100 may have an adhesive force greater than or equal to a predetermined value to adhere the panel support 200 and the panel lower member CP on the panel support 200. For example, in an embodiment, the adhesive member 100 may have an adhesive force greater than or equal to about 1400 gf/inch based on room temperature (25° C.). If the adhesive member 100 has an adhesive force of less than about 1400 gf/inch, the panel support 200 and the panel lower member CP may not be properly adhered.

In an embodiment in which the adhesive member 100 has an adhesive force in the range as described above to adhere the panel support 200 and the panel lower member CP on the panel support 200, the adhesive member 100 may have a modulus within a predetermined range. In some embodiments, a modulus value of the adhesive member 100 may be greater than or equal to about 50 kPa or based on 25° C. However, embodiments of the present disclosure are not necessarily limited thereto.

The adhesive force of the adhesive member 100 according to an embodiment may be different in the first adhesive member 110, the second adhesive member 130, and the third adhesive member 150. Hereinafter, this will be described in detail.

Referring to an embodiment of FIG. 7, as the panel support 200 is folded from the first state to the second state of the display device 1, the adhesive member 100 disposed on the panel support 200 may receive a stress. For example, the first adhesive member 110 may receive a stress applied from each of the ends of both sides thereof in the second direction DR2 to the second direction DR2, the second adhesive member 130 may receive a stress applied from one end thereof in the second direction DR2 to one side in the second direction DR2, and the third adhesive member 150 may receive a stress applied from the other end thereof in the second direction DR2 to the other side in the second direction DR2. Although FIG. 7 illustrates the state in which the display device 1 according to an embodiment is out-folded, the display device 1 according to an embodiment may also have the in-folded state as described above. Hereinafter, for convenience of explanation, the state in which the display device 1 is out-folded will be mainly described, and a description of the state in which the display device 1 is in-folded will be omitted.

As the first lattice pattern 220 and the second lattice pattern 240 disposed at both ends of the first flat plate 210 in the second direction DR2 are folded, a stress may be applied to the first flat plate 210 and the stress applied to the first flat plate 210 may be transferred to the first adhesive member 110. For example, the first adhesive member 110 may receive a first_first stress F1a applied from an end of the other side thereof in the second direction DR2 to the other side in the second direction DR2, and may receive a first_second stress F1b applied from an end of one side thereof in the second direction DR2 to one side in the second direction DR2.

The second flat plate 230 may receive a stress as the first lattice pattern 220 is folded, and the stress applied to the second flat plate 230 may be transferred to the second adhesive member 130. For example, the second adhesive member 130 may receive a second stress F2 applied from an end of one side thereof in the second direction DR2 to one side in the second direction DR2.

The third flat plate 250 may receive a stress as the second lattice pattern 240 is folded, and the stress applied to the third flat plate 250 may be transferred to the third adhesive member 150. For example, the third adhesive member 150 may receive a third stress F3 applied from an end of the other side thereof in the second direction DR2 to the other side in the second direction DR2.

As described above, the number of stresses applied to the first adhesive member 110 may be greater than the number of stresses applied to the second adhesive member 130 or the number of stresses applied to the third adhesive member 150. Accordingly, since the external deformation of the first adhesive member 110 is relatively large, a delamination phenomenon may occur between the first adhesive member 110 and the panel lower member CP disposed on the first adhesive member 110. Accordingly, a buckling phenomenon in which bubbles are generated between the first adhesive member 110 and the panel lower member CP and a mark formed by the bubbles appears on the display device 1 may occur. Since the buckling phenomenon severely damages an appearance of the display device 1 and changes the appearance of the display panel PNL, which also affects device reliability, it is necessary to prevent the buckling phenomenon.

The adhesive force or modulus of the first adhesive member 110 having a relatively large number of applied stresses may be relatively high to prevent the buckling phenomenon of the display device 1. For example, the first adhesive member 110 of the display device 1 according to an embodiment may have an adhesive force greater than or equal to about 1800 gf/inch or a modulus in a range of about 80 kPa to about 100 kPa based on 25° C., and the second adhesive member 130 and the third adhesive member 150 may each have an adhesive force in a range of about 1400 gf/inch to about 1500 gf/inch or a modulus in a range of about 50 kPa to about 70 kPa based on 25° C. Accordingly, by reducing the adhesive force and modulus of the second adhesive member 130 and the third adhesive member 150, folding characteristic of the display device 1 may be increased, and by forming the adhesive force and modulus of the first adhesive member 110 to be relatively high, the buckling phenomenon in which the bubbles are generated between the first adhesive member 110 and the panel lower member CP and the mark formed by the bubbles appears on the display device 1 may be prevented.

The adhesive member 100 may include the pressure-sensitive adhesive or the UV curable material as described above. In an embodiment in which the adhesive member 100 includes the pressure-sensitive adhesive, the adhesive force of the adhesive member 100 may be adjusted using different pressure-sensitive adhesives respectively for at least one of the first to third adhesive members 110, 130, 150, and when the adhesive member 100 includes the UV curable material, the adhesive force of the adhesive member 100 may be adjusted by changing the conditions of a UV curing process.

In an embodiment in which the adhesive member 100 includes the pressure-sensitive adhesive, a pressure-sensitive adhesive having a high adhesive force may be used to increase the adhesive force of the adhesive member 100, and a pressure-sensitive adhesive having a low adhesive force may be used to lower the adhesive force of the adhesive member 100.

In an embodiment in which the adhesive member 100 includes the UV curable material, the adhesive force of the adhesive member 100 may be increased by curing a molecular weight to be large. For example, the adhesive force of the adhesive member 100 may be increased by reducing the amount of additives or initiators required for UV curing, or the adhesive force of the adhesive member 100 may be increased by lengthening the curing time of the UV curable material. Therefore, at least one of the first to third adhesive members 110, 130, 150 may have a different adhesive force from other adhesive members even if the first to third adhesive members 110, 130, 150 are comprised of the same UV curable material.

As described above, since the first adhesive member 110, the second adhesive member 130, and the third adhesive member 150 are spaced apart from each other, the above-described method for adjusting the adhesive force of the adhesive member 100 may be easily applied. Accordingly, it is possible to easily increase the adhesive force of the first adhesive member 110 to be relatively higher than that of the second adhesive member 130 and the third adhesive member 150 and a manufacture of the device may be easily implemented.

Hereinafter, embodiments of the display device 1 will be described. In the following embodiments, the same components as those of the above-described embodiment will be denoted by the same reference numerals, and an overlapping description thereof will be omitted or simplified and differences will be mainly described.

Figure 8:
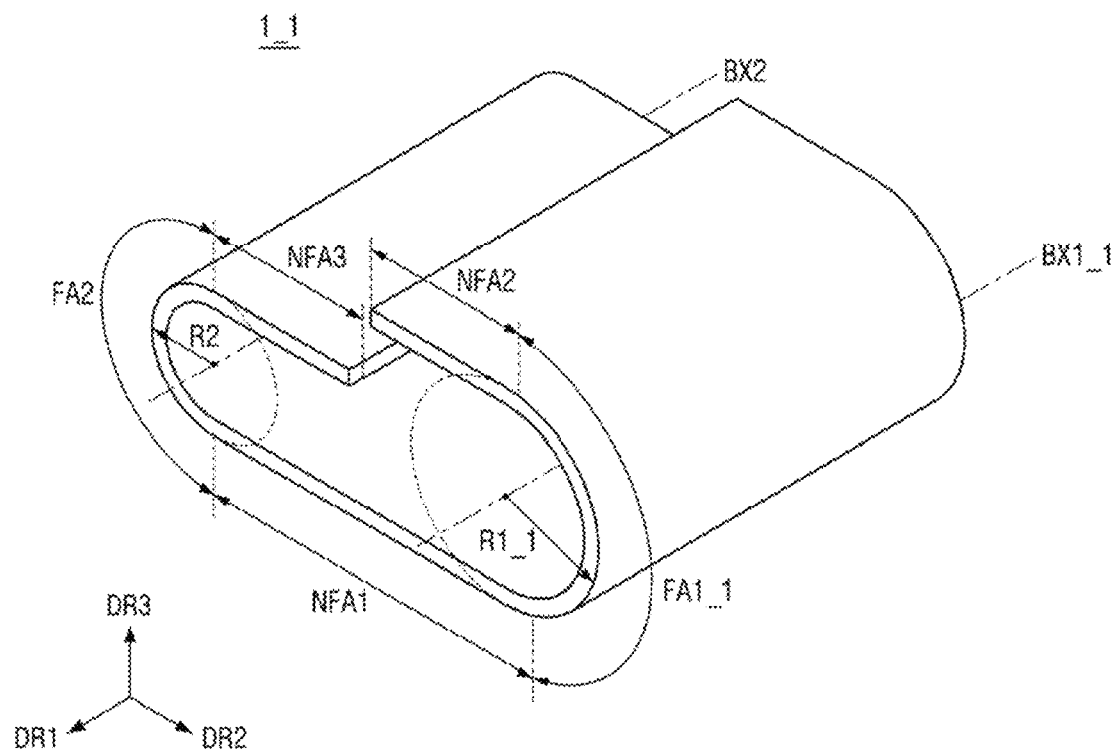
FIG. 8 is a perspective view illustrating a state in which a display device according to another embodiment is folded according to an embodiment of the present disclosure.
Figure 9:
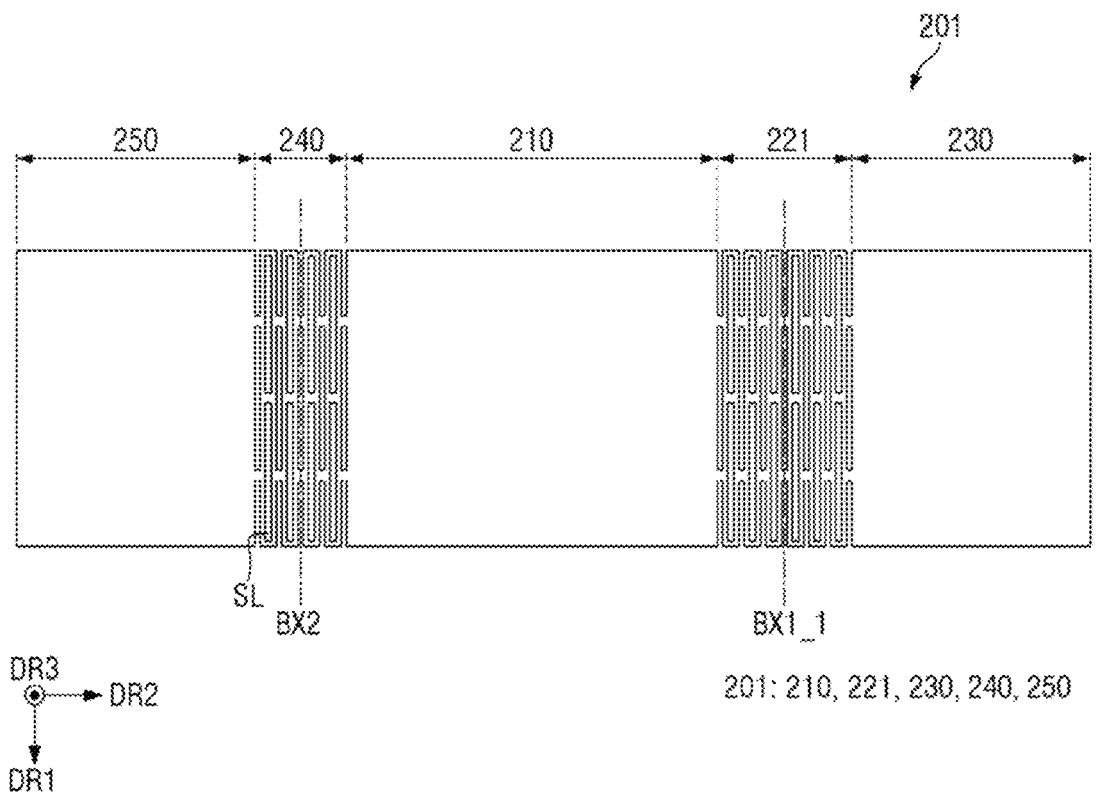
FIG. 9 is a plan view illustrating a top surface of a panel support of the display device of FIG. 8 according to an embodiment of the present disclosure.
Figure 10:
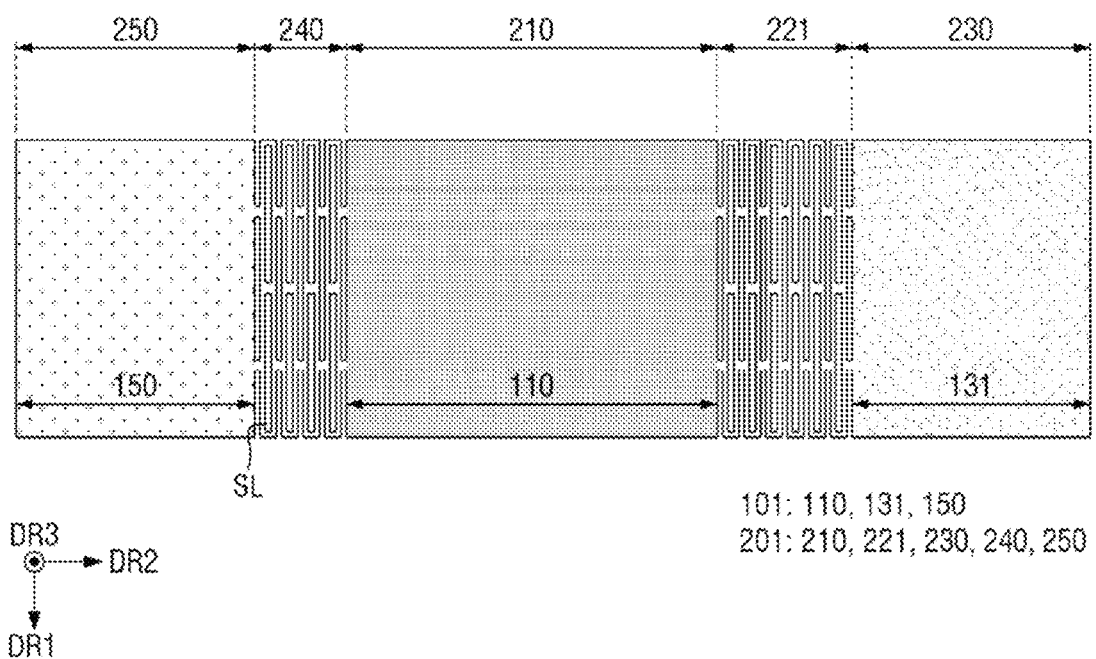
FIG. 10 is a plan view illustrating an adhesive member disposed on the top surface of the panel support of FIG. 9 according to an embodiment of the present disclosure.
Figure 11:
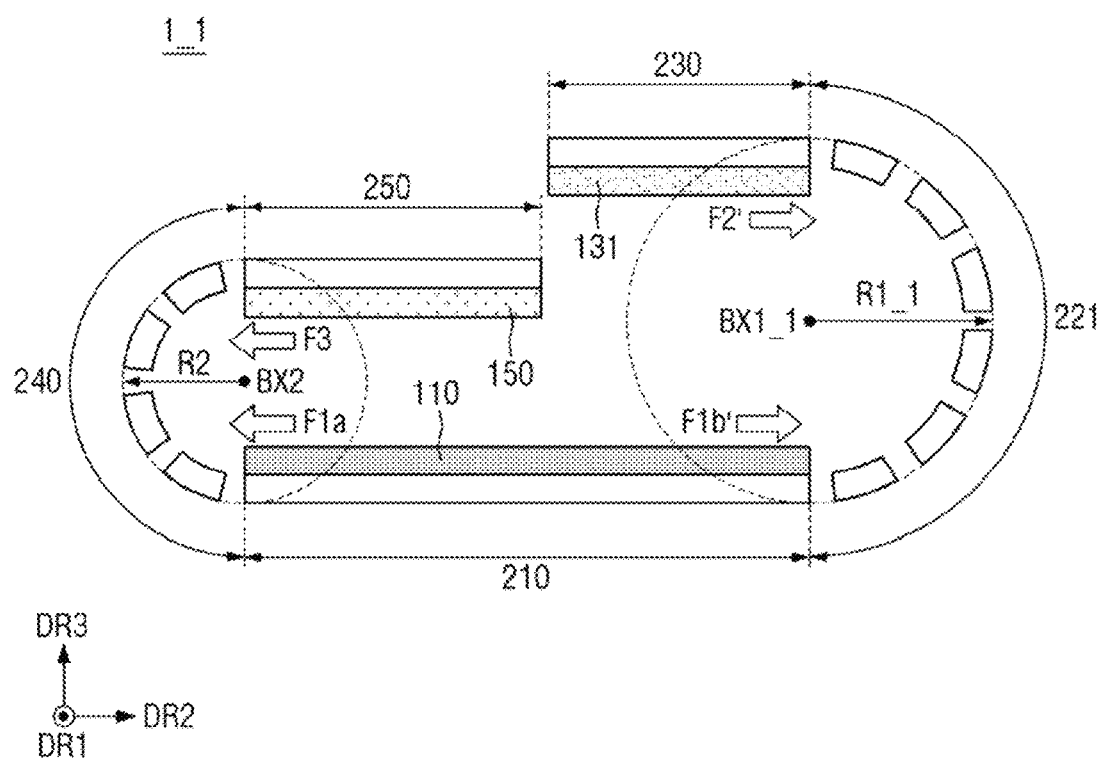
FIG. 11 is a side view illustrating a stress applied to an adhesive member disposed on a top surface of a panel support in a state in which the display device of FIG. 8 is folded according to an embodiment of the present disclosure.

FIG. 8 is a perspective view illustrating a state in which a display device according to an embodiment is folded. FIG. 9 is a plan view illustrating a top surface of a panel support of the display device according to an embodiment of FIG. 8. FIG. 10 is a plan view illustrating an adhesive member disposed on the top surface of the panel support of FIG. 9. FIG. 11 is a side view illustrating a stress applied to an adhesive member disposed on a top surface of a panel support in a state in which the display device of FIG. 8 is folded.

Referring to 8 and 9, it is illustrated that a display device 1_1 according to an embodiment has a first radius of curvature R1_1 greater than the second radius of curvature R2. For example, a first folding area FA1_1 of the display device 1_1 according to an embodiment may have a greater width than the second folding area FA2. Accordingly, a width of a first lattice pattern 221 of a panel support 201 in the second direction DR2 according to an embodiment may be greater than a width of a second lattice pattern 240 in the second direction DR2. In this embodiment, a width of the first separation space V1 between the first adhesive member 110 and the second adhesive member 130 may be greater than a width of the second separation space V2 between the first adhesive member 110 and the third adhesive member 150.

As the first radius of curvature R1_1 of the display device 1_1 according to an embodiment is greater than the second radius of curvature R2, the second non-folding area NFA2 may be disposed on the third non-folding area NFA3 in the second state of the display device 1_1 (e.g., disposed directly thereon in the third direction DR3). In some embodiments, when the display device 1 is in the second state, the second non-folding area NFA2 may partially cover the third non-folding area NFA3 or entirely cover the third non-folding area NFA3. However, embodiments of the present disclosure are not necessarily limited thereto. For example, when the display device 1_1 is in the second state, the second non-folding area NFA2 may not cover the third non-folding area NFA3. Although an embodiment of FIG. 8 illustrates that the display device 1_1 is folded in an in-folding manner, the display device 1_1 may also be folded in an out-folding manner.

Referring to FIGS. 10 and 11, the adhesive force of the first adhesive member 110 according to an embodiment may be higher than those of a second adhesive member 131 and the third adhesive member 150, and the adhesive force of the second adhesive member 131 may be lower than that of the third adhesive member 150.

As the first radius of curvature R1_1 according to the present embodiment becomes larger than the second radius of curvature R2, the magnitude of a first_second stress F1$b'$ applied to an end of one side of the first adhesive member 110 in the second direction DR2 and a second stress F2' applied to an end of one side of the second adhesive member 131 in the second direction DR2 may be relatively reduced. Accordingly, a relatively lower adhesive force or modulus than that of the third adhesive member 150 may be applied to the second adhesive member 131, and as the adhesive force or modulus of the second adhesive member 131 is lower than that of the third adhesive member 150, the adhesive force or modulus of the adhesive member 101 may be reduced to further increase the folding performance of the display device 1_1. In some embodiments, the first adhesive member 110 has an adhesive force greater than equal to about 1800 gf/inch or a modulus in a range of about 80 kPa to about 100 kPa based on 25° C., the second adhesive member 130 and the third adhesive member 150 each have an adhesive force in a range of about 1400 gf/inch to about 1500 gf/inch or less, or a modulus in a range of about 50 kPa to about 70 kPa based on 25° C., and the adhesive force or modulus of the second adhesive member 130 may be lower than that of the third adhesive member 150. However, embodiments of the present disclosure are not necessarily limited thereto.

Figure 12:
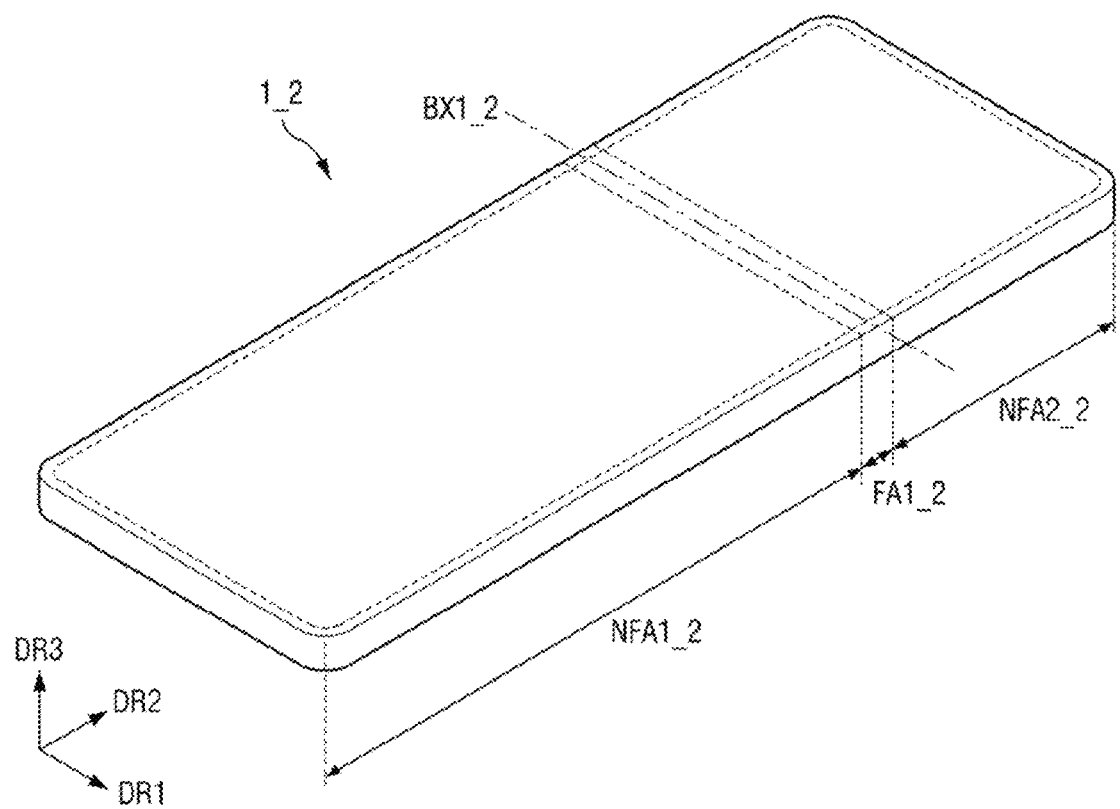
FIG. 12 is a perspective view illustrating a display device according to an embodiment of the present disclosure.
Figure 13:
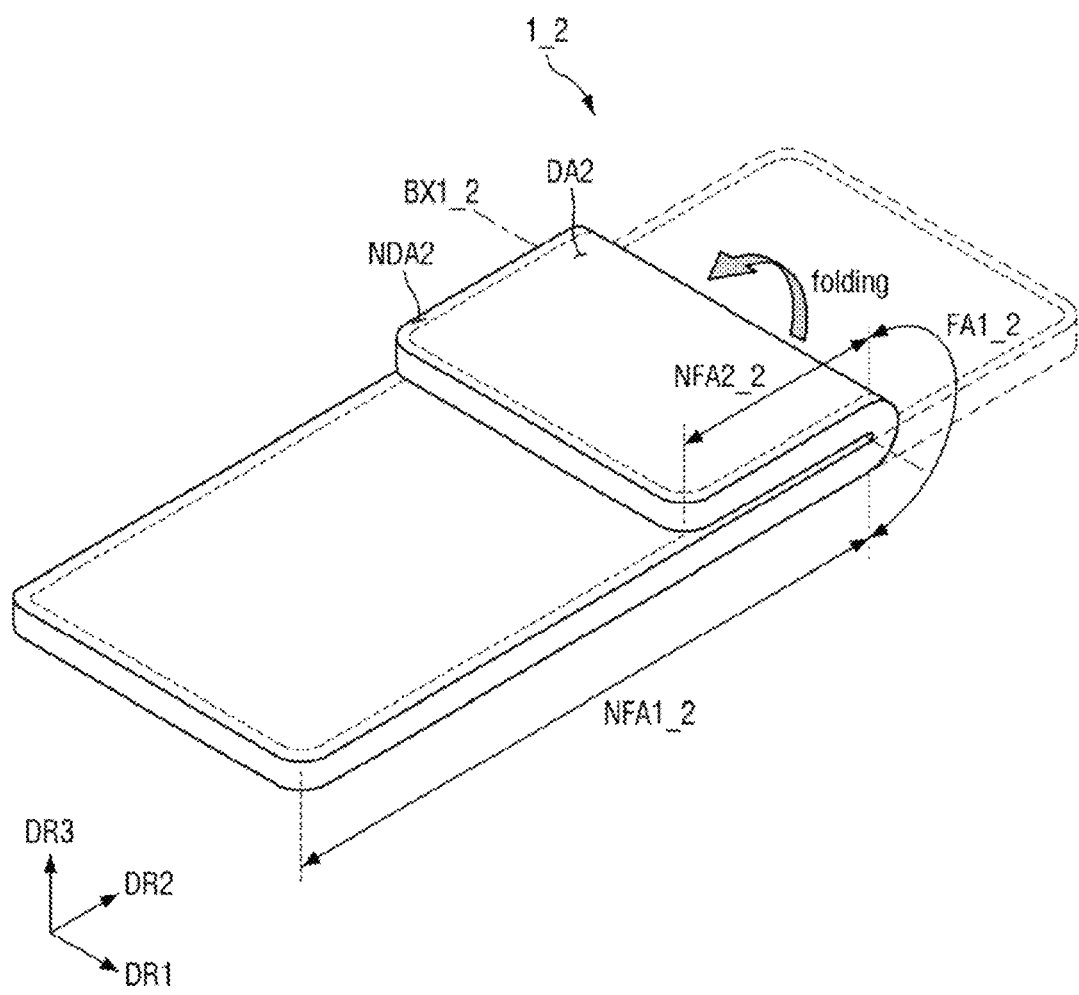
FIG. 13 is a perspective view illustrating a state in which the display device of FIG. 12 is folded according to an embodiment of the present disclosure.
Figure 14:
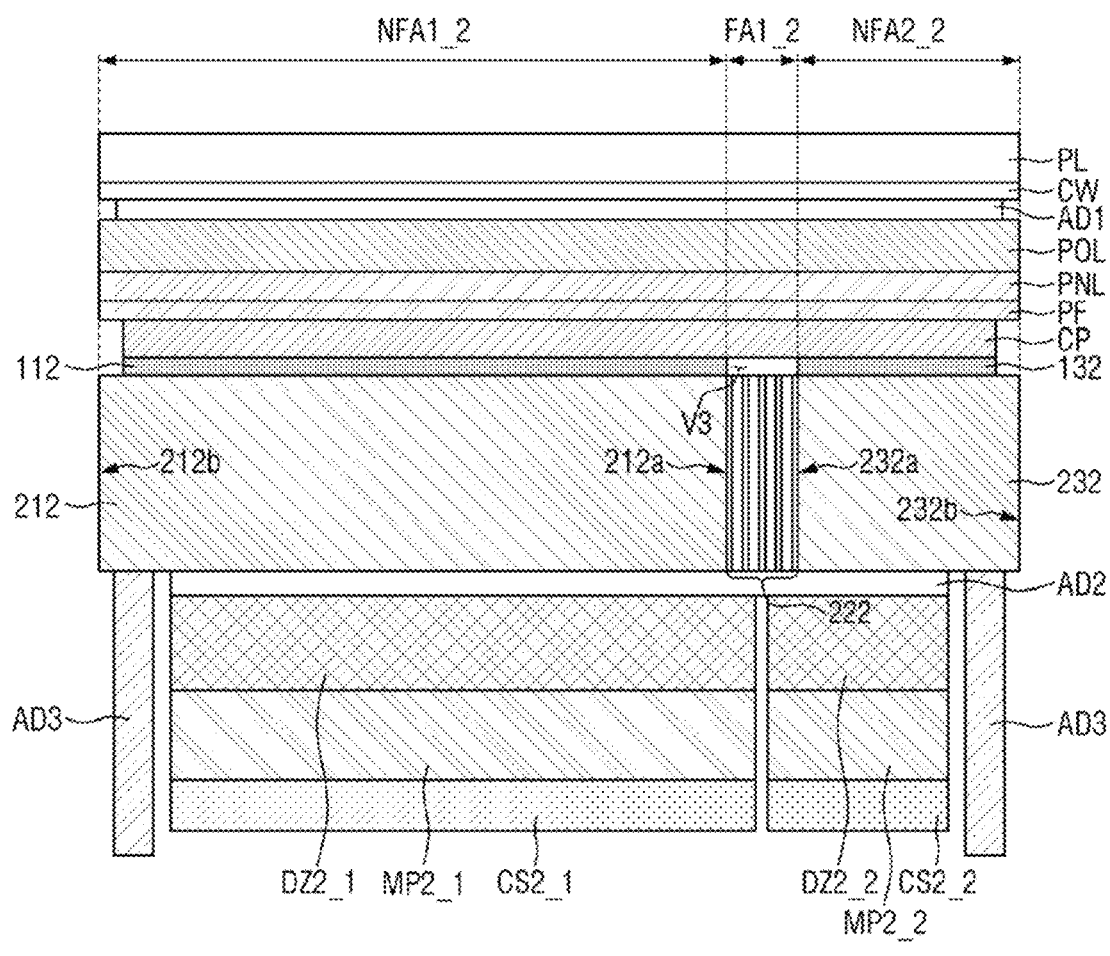
FIG. 14 is a side view schematically illustrating a structure of the display device of FIG. 12 according to an embodiment of the present disclosure.
Figure 15:
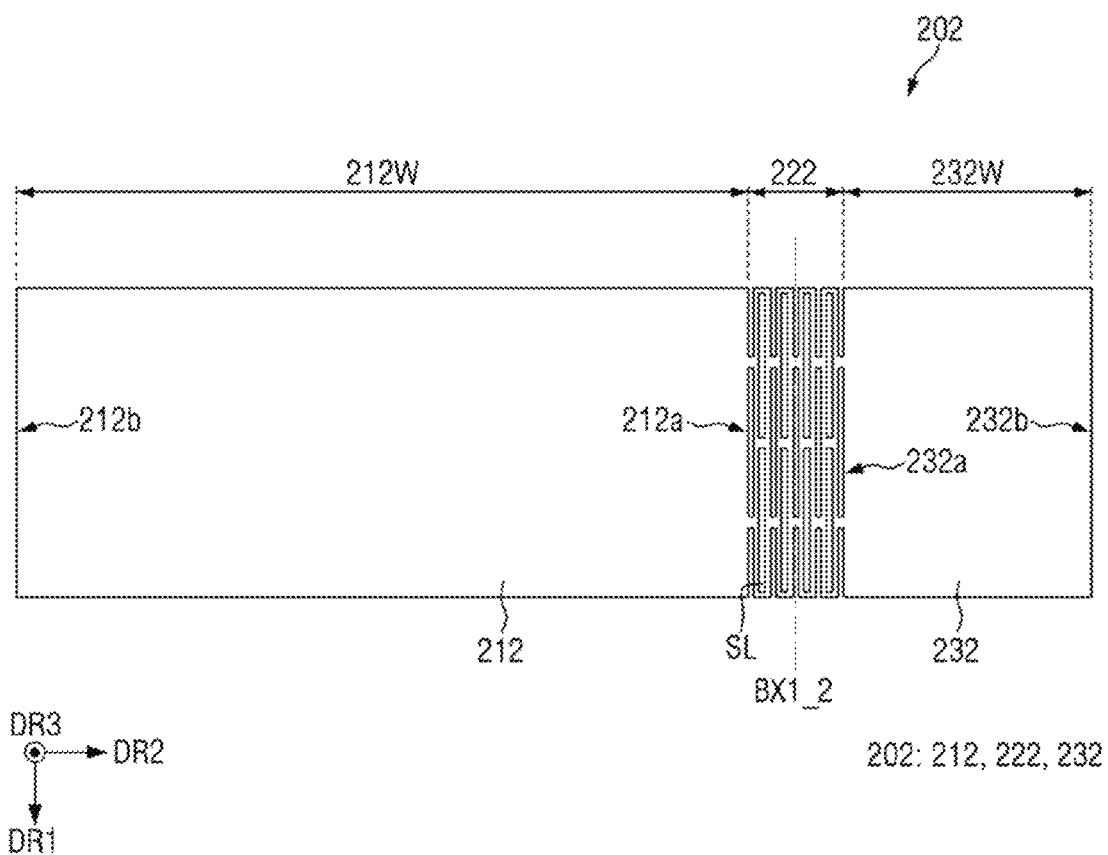
FIG. 15 is a plan view illustrating a top surface of a panel support of the display device of FIG. 12 according to an embodiment of the present disclosure.
Figure 16:
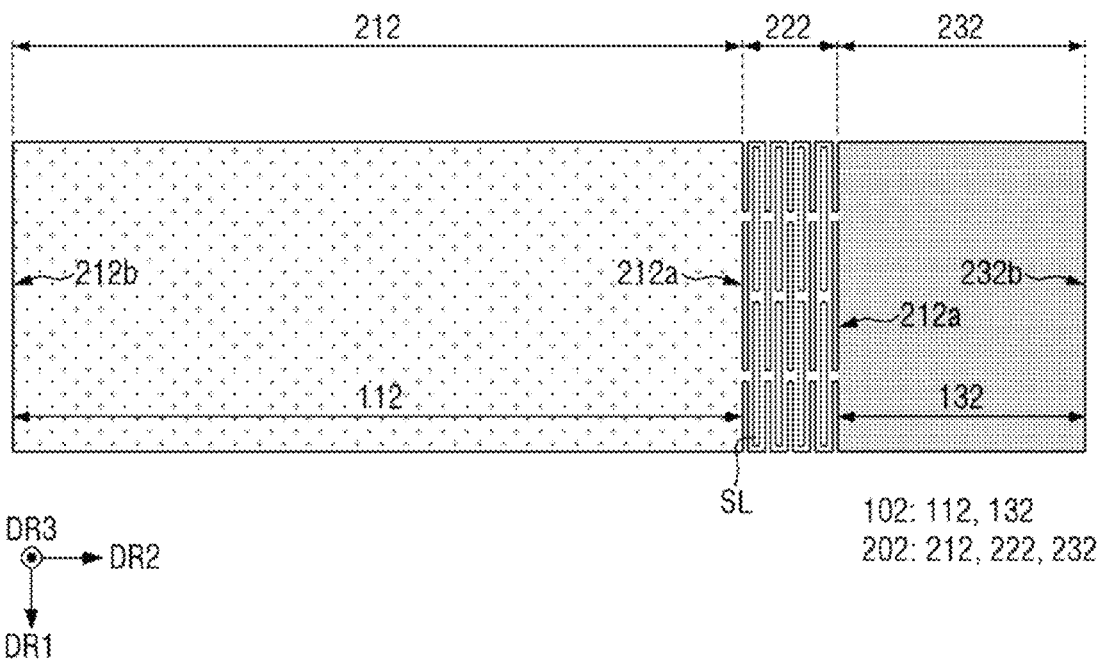
FIG. 16 is a plan view illustrating an adhesive member disposed on the top surface of the panel support of FIG. 15 according to an embodiment of the present disclosure.
Figure 17:
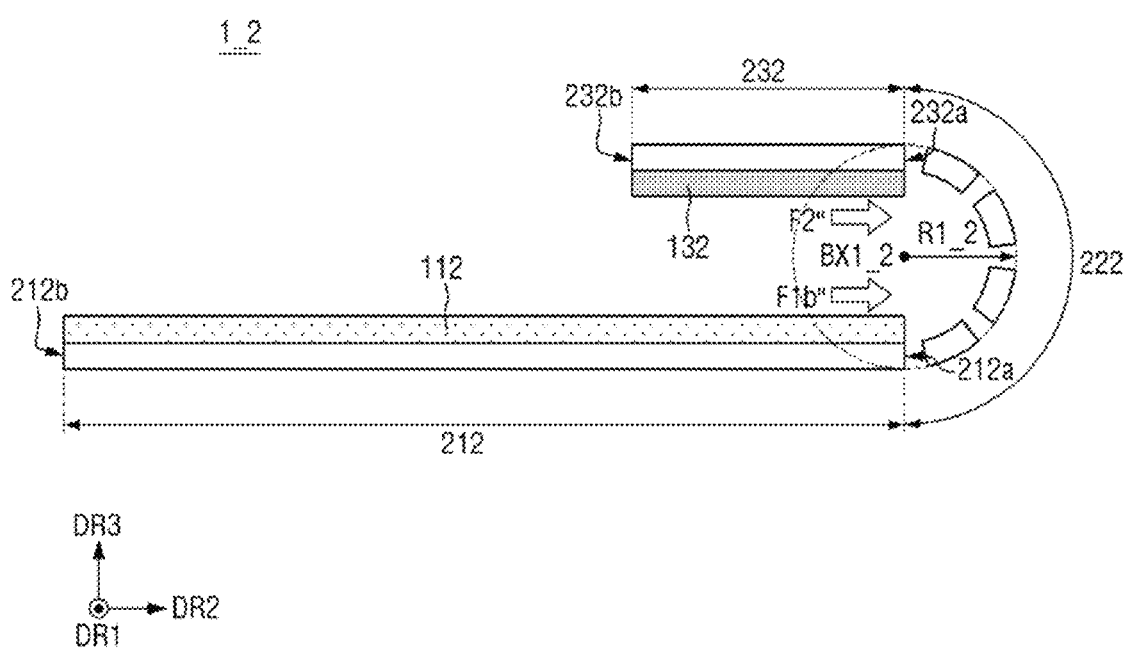
FIG. 17 is a side view illustrating a stress applied to an adhesive member disposed on a top surface of a panel support in a state in which the display device of FIG. 12 is folded according to an embodiment of the present disclosure.

FIG. 12 is a perspective view illustrating a display device according to an embodiment FIG. 13 is a perspective view illustrating a state in which the display device of FIG. 12 is folded. FIG. 14 is a side view schematically illustrating a structure of the display device of FIG. 12. FIG. 15 is a plan view illustrating a top surface of a panel support of the display device according to an embodiment of FIG. 12. FIG. 16 is a plan view illustrating an adhesive member disposed on the top surface of the panel support of FIG. 15. FIG. 17 is a side view illustrating a stress applied to an adhesive member disposed on a top surface of a panel support in a state in which the display device of FIG. 12 is folded.

Compared to the display device 1 according to the embodiment of FIG. 1, a display device 1_2 according to the present embodiment has substantially the same configuration except that the third non-folding area NFA3 and the second folding area FA2 are omitted, and a width of a first non-folding area NFA1_2 in the second direction DR2 is greater than a width of a second non-folding area NFA2_2 in the second direction DR2. For example, in an embodiment, the area of the first non-folding area NFA1_2 may be greater than a width of the area of the second non-folding area FA2_2.

Referring to FIGS. 12 and 13, it is illustrated that the display device 1_2 according to embodiments has different widths of the first non-folding area NFA1_2 and the second non-folding area NFA2_2 in the second direction DR2. For example, the width of the first non-folding area NFA1_2 in the second direction DR2 may be greater than the width of the second non-folding area NFA2_2 in the second direction DR2. In some embodiments, the display device 1_2 may have one folding axis BX1_2. However, embodiments of the present disclosure are not necessarily limited thereto. For example, the display device 1_2 may have a plurality of folding axes.

When the display device 1_2 is in the second state, the second non-folding area NFA2_2 may cover only a portion of the first non-folding area NFA1_2. Accordingly, a portion of the first non-folding area NFA1_2 may be exposed.

Referring to FIGS. 14 and 15, the display device 1_2 according to embodiments is substantially the same as that in which the third adhesive member 150, the second separation space V2, the third flat plate 250, the second lattice pattern 240, the third digitizer member DZ_3, the third metal support member MP_3, and the third buffer member CS_3 are omitted from the display device 1 according to an embodiment of FIG. 4, and is different from the display device 1 according to an embodiment of FIG. 4 in that widths of a first flat plate 212 and a second flat plate 232 in the second direction DR2, widths of a first metal support member MP2_1 and a second metal support member MP2_2 in the second direction DR2, widths of a first digitizer member DZ2_1 and a second digitizer member DZ2_2 in the second direction DR2, and widths of a first buffer member CS2_1 and a second buffer member CS2_2 in the second direction DR2 are different, respectively.

For example, the width of the first flat plate 212 of the display device 1_2 according to an embodiment in the second direction DR2 may be greater than the width of the second flat plate 232 in the second direction DR2, the width of the first metal support member MP2_1 in the second direction DR2 may be greater than the width of the second metal support member MP2_2 in the second direction DR2, the width of the first digitizer member DZ2_1 in the second direction DR2 may be greater than the width of the second digitizer member DZ2_2 in the second direction DR2, and the width of the first buffer member CS2_1 in the second direction DR2 may be greater than the width of the second buffer member CS2_2 in the second direction DR2.

The first flat plate 212 of the panel support 202 may include a first fixed end 212a in direct contact with the first lattice pattern 222 as one side surface thereof in the second direction DR2, and may include a first free end 212b opposing the first fixed end 212a in the second direction DR2 as the other side surface thereof in the second direction DR2. The first fixed end 212a may be a boundary between the first lattice pattern 222 and the first flat plate 212. A width of the first flat plate 212 in the second direction DR2 may be a distance 212W between the first fixed end 212a and the first free end 212b.

The second flat plate 232 may include a second fixed end 232a in direct contact with the first lattice pattern 220 as the other side surface thereof in the second direction DR2, and may include a second free end 232b opposing the second fixed end 232a in the second direction DR2 as one side surface thereof in the second direction DR2. The second fixed end 232a may be a boundary between the first lattice pattern 222 and the second flat plate 232. A width of the second flat plate 232 in the second direction DR2 may be a distance 232W between the second fixed end 232a and the second free end 232b.

In some embodiments, the widths of the first flat plate 212 and the second flat plate 232 in the first direction DR1 are substantially the same, and an area of the top surface of the first flat plate 212 in a plan view may be larger than an area of the top surface of the second flat plate 232 in a plan view. However, embodiments of the present disclosure are not necessarily limited thereto.

Referring to FIGS. 16 and 17, the adhesive force of the first adhesive member 112 disposed on the first flat plate 212 according to an embodiment may be lower than that of the second adhesive member 132 disposed on the second flat plate 232.

When the display device 1_2 according to an embodiment is in the second state, the adhesive member 102 disposed on the panel support 202 may receive a stress as the panel support 202 is folded. For example, the first adhesive member 112 may receive a stress applied from an end of one side thereof in the second direction DR2 to one side in the second direction DR2, and the second adhesive member 132 may receive a stress applied from an end of one side thereof in the second direction DR2 to one side in the second direction DR2.

As the first lattice pattern 222 disposed on one side of the first flat plate 212 in the second direction DR2 is folded, a stress may be applied to the first flat plate 212 and the stress applied to the first flat plate 212 may be transferred to the first adhesive member 112. For example, the first adhesive member 112 may receive a first second stress $F1b"$ applied from an end of one side thereof in the second direction DR2 to one side in the second direction DR2.

The second flat plate 232 may receive a stress as the first lattice pattern 222 is folded, and the stress applied to the second flat plate 232 may be transferred to the second adhesive member 132. For example, the second adhesive member 132 may receive a second stress $F2"$ applied from an end of one side thereof in the second direction DR2 to one side in the second direction DR2.

The width of the first flat plate 212 in the first direction DR1 is greater than the width of the second flat plate 232 in the first direction DR1, and therefore, when the first lattice pattern 222 is folded, the stress applied to the second flat plate 232 may be greater than the stress applied to the first flat plate 212. Accordingly, the first_second stress $F1b"$ applied to the first flat plate 212 may be less than the second Stress $F2"$ applied to the second flat plate 232.

For example, since the stress applied to the second adhesive member 132 disposed on the second flat plate 232 is relatively large, an external deformation of the second adhesive member 132 may be relatively greater than that of the first adhesive member 1112. Therefore, since the above-described buckling phenomenon may occur due to the delamination phenomenon occurring between the second adhesive member 132 and the panel lower member CP, the adhesive force or modulus of the second adhesive member 132 may be higher than that of the first adhesive member 112 to prevent the buckling phenomenon. For example, in an embodiment, the first adhesive member 112 may have an adhesive force in a range of about 1400 gf/inch to about 1500 gf/inch or a modulus in a range of about 50 kPa to about 70 kPa based on 25° C., and the second adhesive member 132 may have an adhesive force greater than or equal to about 1800 gf/inch or a modulus in a range of about 80 kPa to about 100 kPa based on 25° C.

With the configuration as described above, the manufacture of the display device 1_2 according to an embodiment may be easily implemented and the buckling phenomenon may be prevented.

In concluding the detailed description, those skilled in the art will appreciate that many variations and modifications can be made to embodiments without substantially departing from the principles of the present disclosure. Therefore, the disclosed embodiments are used in a generic and descriptive sense only and not for purposes of limitation.

What is claimed is:

1. A display device comprising:
a display panel including a first folding area that is foldable, a second folding area that is foldable, the second folding area is spaced apart from a first side of the first folding area in a first direction, a first non-folding area is disposed between the first folding area and the second folding area in the first direction, and a second non-folding area is disposed on second side of the first non-folding area that is opposite to the first side, the fist folding area is interposed between the first non-folding area and the second non-folding area in the first direction;
a panel support disposed on a lower side of the display panel; and
an adhesive member interposed between the display panel and the panel support,
wherein the panel support includes:
a first lattice pattern overlapping the first folding area,
a second lattice pattern overlapping the second folding area,
a first flat plate overlapping the first non-folding area, and
a second flat plate overlapping the second non-folding area,
the adhesive member includes:
a first adhesive member disposed on the first flat plate and directly contacting the first flat plate, and
a second adhesive member disposed on the second flat plate and directly contacting the second flat plate, and
an adhesive force between the first adhesive member and the first flat plate is greater than an adhesive force between the second adhesive member and the second flat plate.

2. The display device of claim 1, wherein:
the panel support further includes a third flat plate disposed on a first side of the second lattice pattern in the first direction:
the adhesive member further includes a third adhesive member disposed on the third flat plate and directly contacting the third flat plate; and
the adhesive force between the first adhesive member and the first flat plate is greater than an adhesive force between the third adhesive member and the third flat plate.

3. The display device of claim 2, wherein a modulus of the first adhesive member is greater than a modulus of the second adhesive member and a modulus of the third adhesive member.

4. The display device of claim 2, wherein:
the first folding area of the display panel is folded with a first radius of curvature;
the second folding area of the display panel is folded with a second radius of curvature that is greater than the first radius of curvature; and
the adhesive force between the second adhesive member and the second flat plate is greater than the adhesive force between the third adhesive member and the third flat plate.

5. The display device of claim 4, wherein a width of a separation space that separates the first adhesive member and the second adhesive member is less than a width of a separation space that separates the first adhesive member and the third adhesive member.

6. The display device of claim 2, wherein:
the first adhesive member, the second adhesive member, and the third adhesive member are spaced apart from each other;
the first folding area overlaps a first separation space between the first adhesive member and the second adhesive member; and
the second folding area overlaps a second separation space between the first adhesive member and the third adhesive member.

7. The display device of claim 6, wherein:
the first lattice pattern overlaps the first separation space; and
the second lattice pattern overlaps the second separation space.

8. The display device of claim 7, further comprising a digitizer member disposed on a lower side of the panel support, wherein the digitizer member includes:
a first digitizer member overlapping the first adhesive member;
a second digitizer member overlapping the second adhesive member; and
a third digitizer member overlapping the third adhesive member,
a third separation space between the first digitizer member and the second digitizer member overlaps the first separation space; and
a fourth separation space between the first digitizer member and the third digitizer member overlaps the second separation space.

9. The display device of claim 8,
further comprising a metal support disposed between the panel support and the digitizer member, wherein the metal support includes:
a first metal support member overlapping the first adhesive member;
a second metal support member overlapping the second adhesive member; and
a third metal support member overlapping the third adhesive member,
a fifth separation space between the first metal support member and the second metal support member overlaps the first separation space; and
a sixth separation space between the first metal support member and the third metal support member overlaps the second separation space.

10. The display device of claim 1, further comprising:
a panel lower member disposed between the display panel and the adhesive member,
wherein the panel lower member includes at least one of a light blocking portion for absorbing external light and a buffer portion for absorbing an external shock.

11. The display device of claim 10, wherein:
a bottom surface of the panel lower member directly contacts the first adhesive member and the second adhesive member; and
the first adhesive member and the second adhesive member are spaced apart from each other.

12. The display device of claim 10, wherein an adhesive force between the first adhesive member and the panel lower member is greater than an adhesive force between the second adhesive member and the panel lower member.

13. The display device of claim 10, wherein the first adhesive member and the second adhesive member each includes a pressure-sensitive adhesive, the pressure-sensitive adhesive included in the first adhesive member is different from the pressure-sensitive adhesive included in the second adhesive member.

14. The display device of claim 10, wherein the first adhesive member and the second adhesive member include a same UV curable material.

15. A display device comprising:
a display panel including a first folding area that is foldable, a first non-folding area disposed on a first side of the first folding area in a first direction, and a second non-folding area disposed on a second side of the first non-folding area that is opposite to the first side, the first folding area is interposed between the first non-folding area and the second non-folding area in the first direction;
a panel support disposed on a lower side of the display panel; and
an adhesive member interposed between the display panel and the panel support,
wherein the panel support includes a first lattice pattern overlapping the first folding area, a first flat plate overlapping the first non-folding area, and a second flat plate overlapping the second non-folding area,
the adhesive member includes a first adhesive member disposed on the first flat plate and directly contacting the first flat plate, and a second adhesive member disposed on the second flat plate and directly contacting the second flat plate,
a width of the first non-folding area is less than a width of the second non-folding area,
a width of the first flat plate is less than a width of the second flat plate, and
an adhesive force between the first adhesive member and the first flat plate is greater than an adhesive force between the second adhesive member and the second flat plate.

16. The display device of claim 15, wherein an area of the first non-folding area is less than an area of the second non-folding area.

17. The display device of claim 15, further comprising:
a panel lower member disposed between the display panel and the adhesive member,
wherein the panel lower member includes at least one of a light blocking portion for absorbing external light and a buffer portion for absorbing an external shock.

18. The display device of claim 17, wherein:
a bottom surface of the panel lower member directly contacts the first adhesive member and the second adhesive member;
the first adhesive member and the second adhesive member are spaced apart from each other; and
an adhesive force between the first adhesive member and the panel lower member is greater than an adhesive force between the second adhesive member and the panel lower member.

19. The display device of claim 18, wherein a width of the first adhesive member in the first direction is less than a width of the second adhesive member in the first direction.

20. The display device of claim 19, further comprising:
a digitizer member disposed on a lower side of the panel support, wherein the digitizer member includes a first digitizer member overlapping the first adhesive member and a second digitizer member overlapping the second adhesive member; and
a width of the first digitizer member in the first direction is less than a width of the second digitizer member in the first direction.

* * * * *